(12) United States Patent
Lee et al.

(10) Patent No.: US 9,576,955 B2
(45) Date of Patent: Feb. 21, 2017

(54) SEMICONDUCTOR DEVICE HAVING STRAINED CHANNEL LAYER AND METHOD OF MANUFACTURING THE SAME

(71) Applicant: Samsung Electronics Co., Ltd., Suwon-si (KR)

(72) Inventors: Jae Hwan Lee, Seoul (KR); Tae Yong Kwon, Suwon-si (KR); Sang Su Kim, Yongin-si (KR); Chang Jae Yang, Seoul (KR); Jung Han Lee, Anyang-si (KR); Hwan Wook Choi, Yongin-si (KR); Yeon Cheol Heo, Suwon-si (KR); Sang Hyuk Hong, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/992,683

(22) Filed: Jan. 11, 2016

(65) Prior Publication Data
US 2016/0329327 A1    Nov. 10, 2016

(30) Foreign Application Priority Data

May 4, 2015    (KR) .......................... 10-2015-0062538

(51) Int. Cl.
| | | |
|---|---|---|
| *H01L 21/84* | (2006.01) | |
| *H01L 27/088* | (2006.01) | |
| *H01L 29/78* | (2006.01) | |
| *H01L 29/10* | (2006.01) | |
| *H01L 29/161* | (2006.01) | |
| *H01L 29/06* | (2006.01) | |

(52) U.S. Cl.
CPC ....... *H01L 27/0886* (2013.01); *H01L 29/0649* (2013.01); *H01L 29/1054* (2013.01); *H01L 29/161* (2013.01); *H01L 29/7848* (2013.01); *H01L 29/7849* (2013.01)

(58) Field of Classification Search
CPC .............. H01L 29/161; H01L 29/7849; H01L 29/0649; H01L 29/1054; H01L 29/7848; H01L 21/823431; H01L 21/823821; H01L 21/845; H01L 27/0924; H01L 27/1211
See application file for complete search history.

(56) References Cited

U.S. PATENT DOCUMENTS

| | | | |
|---|---|---|---|
| 8,222,680 B2 | 7/2012 | Lin et al. | |
| 2006/0189058 A1* | 8/2006 | Lee ................. | H01L 29/66795 438/198 |
| 2007/0010073 A1 | 1/2007 | Chen et al. | |
| 2008/0050931 A1 | 2/2008 | Furukawa et al. | |
| 2008/0093674 A1 | 4/2008 | Lee et al. | |
| 2009/0179226 A1* | 7/2009 | Teo ................... | H01L 21/76254 257/190 |

(Continued)

*Primary Examiner* — Jarrett Stark
*Assistant Examiner* — Bitew Dinke
(74) *Attorney, Agent, or Firm* — Myers Bigel, P.A.

(57) ABSTRACT

Semiconductor devices are provided. The semiconductor devices include active fins including a buffer layer disposed on a substrate and a channel layer disposed on the buffer layer and having a first second lattice constant higher than a lattice constant of the buffer layer, a gate structure covering the channel layer and intersecting the active fins, sidewall spacers disposed on both sidewalls of the gate structure, and capping layers disposed to contact lower surfaces of the sidewall spacers and having a width substantially the same as a width of the lower surfaces of the sidewall spacers.

15 Claims, 18 Drawing Sheets

(56) References Cited

U.S. PATENT DOCUMENTS

| | | |
|---|---|---|
| 2010/0059821 A1 | 3/2010 | Rios et al. |
| 2012/0091538 A1 | 4/2012 | Lin et al. |
| 2012/0187450 A1 | 7/2012 | Jakubowski et al. |
| 2014/0008730 A1* | 1/2014 | Mitard .................. H01L 27/092 257/369 |
| 2014/0027816 A1 | 1/2014 | Cea et al. |
| 2014/0070273 A1 | 3/2014 | Cea et al. |
| 2014/0145242 A1 | 5/2014 | Huang et al. |
| 2014/0151766 A1 | 6/2014 | Eneman et al. |
| 2014/0264602 A1 | 9/2014 | Basker et al. |
| 2014/0335673 A1* | 11/2014 | Kim .................. H01L 29/66545 438/283 |
| 2014/0367741 A1* | 12/2014 | Yang ....................... H01L 29/04 257/190 |
| 2015/0021683 A1* | 1/2015 | Xie ..................... H01L 29/6653 257/330 |
| 2015/0102385 A1* | 4/2015 | Fung ................. H01L 21/02381 257/190 |
| 2015/0137263 A1* | 5/2015 | Lee ................... H01L 29/66795 257/401 |
| 2015/0145073 A1* | 5/2015 | Lee ..................... H01L 29/6656 257/411 |
| 2015/0249087 A1* | 9/2015 | Cantoro .............. H01L 27/0924 257/369 |
| 2015/0263128 A1* | 9/2015 | Basker ................ H01L 29/6681 257/288 |
| 2015/0348966 A1* | 12/2015 | Zhao ................... H01L 27/0886 257/401 |
| 2015/0357440 A1* | 12/2015 | Cheng ............... H01L 29/66795 257/401 |
| 2016/0163863 A1* | 6/2016 | Jacob .................. H01L 29/7851 257/401 |

* cited by examiner

SEMICONDUCTOR DEVICE HAVING STRAINED CHANNEL LAYER AND METHOD OF MANUFACTURING THE SAME

CROSS-REFERENCE TO RELATED APPLICATION

This application claims priority under 35 U.S.C. §119 to Korean Patent Application No. 10-2015-0062538, filed on May 4, 2015, in the Korean Intellectual Property Office, the contents of which are incorporated herein by reference in their entirety.

BACKGROUND

1. Technical Field

Example embodiments of the present inventive concepts relate to semiconductor devices having a strained channel layer and methods of manufacturing the same.

2. Description of the Related Art

As the degree of integration of semiconductor devices has increased, the sizes of the semiconductor devices have decreased. In order to overcome limitations of device characteristics in the semiconductor devices having smaller sizes, efforts have been made to develop semiconductor devices including fin field effect transistors (FinFET) having a three-dimensional channel. In addition, in order to implement a high-performance field effect transistor, efforts have been made to develop semiconductor devices having a strained channel layer to increase the mobility of electrons or electron holes thereof.

SUMMARY

Aspects of the present inventive concepts may provide semiconductor devices having improved mobility characteristics and a method of manufacturing the same.

According to example embodiments of the present inventive concepts, semiconductor devices may include a substrate, a plurality of active fins on the substrate, the active fins including a buffer layer on the substrate and a channel layer on the buffer layer, and the channel layer having a first lattice constant higher than a second lattice constant of the buffer layer, a gate structure covering the channel layer and intersecting the active fins, a plurality of sidewall spacers on both sidewalls of the gate structure, a plurality of source/drain structures on both sides of the channel layer, and a plurality of capping layers contacting lower surfaces of the sidewall spacers and having a width substantially the same as a width of the lower surfaces of the sidewall spacers.

The plurality of capping layers may be disposed between the sidewall spacers and the channel layer. A sidewall of respective ones of the plurality of capping layers may contact respective ones of the plurality of source/drain structures.

The plurality of capping layers may extend along the gate structure while covering the channel layer.

The plurality of capping layers may include a material preventing oxygen from being diffused into the channel layer.

The material preventing oxygen from being diffused into the channel layer may include SiN and/or SiCN.

The channel layer may be formed of a silicon-germanium compound.

The channel layer may include a plurality of regions having different germanium contents.

The channel layer may include a central portion having a first germanium content and a surface portion having a second germanium content higher than the first germanium content.

The buffer layer may be formed of a silicon-germanium compound having a first germanium content lower than a second germanium content in the channel layer.

Respective ones of the plurality of source/drain structures may include a protruding portion projecting under the plurality of sidewall spacers.

Respective ones of the plurality of capping layer may be disposed between a lower surface of respective ones of the plurality of sidewall spacers and the protruding portion of respective ones of the plurality of source/drain structures.

According to example embodiments of the present inventive concepts, semiconductor devices may include active fins including a buffer layer disposed on a substrate and a channel layer disposed on the buffer layer and having a first lattice constant higher than a second lattice constant of the buffer layer, an isolation layer disposed between the active fins, a gate structure covering the channel layer and intersecting the active fins, sidewall spacers disposed on both sidewalls of the gate structure, source/drain structures on both sides of the channel layer, and capping layers contacting lower surfaces of the sidewall spacers and having a first width substantially the same as a second width of the lower surfaces of the sidewall spacers.

The capping layers may be disposed between the sidewall spacers and the channel layer, and between the sidewall spacers and the isolation layer.

The source/drain structures may be in contact with the channel layer at both sides of the gate structure.

The source/drain structures may be formed of silicon-germanium compound and may have a first germanium content higher than a second germanium content in the channel layer.

The gate structure may include a gate insulation layer including a high-k material and a gate electrode including a metal material.

According to example embodiments of the present inventive concepts, semiconductor devices may include a substrate including a first region and a second region, first active fins disposed in the first region and including a first channel layer, second active fins disposed in the second region and may include a second channel layer having a second lattice constant lower than a first lattice constant of the first channel layer, a first gate structure covering the first channel layer and intersecting the first active fins, a second gate structure covering the second channel layer and intersecting the second active fins, first sidewall spacers disposed on both sidewalls of the first gate structure, second sidewall spacers on both sidewalls of the second gate structure, and a capping layer contacting lower surfaces of the first sidewall spacers and having a first width substantially the same as a second width of the lower surfaces of the first sidewall spacers.

The first channel layer may be formed of a silicon-germanium compound. The second channel layer may be formed of silicon. The second sidewall spacers may directly contact with the second channel layer.

The semiconductor device may further include a first buffer layer disposed below the first channel layer and a second buffer layer disposed below the second channel layer.

The first channel layer may be formed of a material having the first lattice constant higher than a third lattice constant of the first buffer layer, and the second channel layer may be formed of a material having the second lattice constant lower than a fourth lattice constant of the second buffer layer.

According to example embodiments of the present inventive concepts, methods of manufacturing semiconductor devices may include preparing a substrate having a first region and a second region, forming first active fins disposed in the first region and including a first channel layer, forming second active fins disposed in the second region and including a second channel layer having a second lattice constant lower than a first lattice constant of the first channel layer, forming a capping layer surrounding the first channel layer, forming a sacrificial oxidation layer on the second channel layer by heat-treating the substrate in an oxidation atmosphere, forming a first sacrificial gate disposed on the capping layer and intersecting the first active fins and a second sacrificial gate disposed on the sacrificial oxidation layer and intersecting the second active fins, forming first sidewall spacers disposed on both sidewalls of the first sacrificial gate and second sidewall spacers disposed on both sidewalls of the second sacrificial gate, forming first source/drain structures on a first fin recess formed by etching a portion of the capping layer and a portion of the first channel layer along side surfaces of the first sidewall spacers, and forming a first gate structure in a first gate recess formed by removing the first sacrificial gate and a portion of the capping layer.

The capping layer may be disposed to contact lower surfaces of the first sidewall spacers, and formed to have a first width substantially the same as a second width of the lower surfaces of the first sidewall spacers.

The capping layer may be formed between the first channel layer and the first sidewall spacers.

The first channel layer may be formed of a silicon-germanium compound, and the second channel layer may be formed of silicon.

The methods of manufacturing semiconductor devices may further include forming second source/drain structures in a second fin recess formed by etching a portion of the second channel layer along side surfaces of the second sidewall spacers, and forming a second gate structure in a second gate recess formed by removing the second sacrificial gate and a portion of the sacrificial oxidation layer.

BRIEF DESCRIPTION OF DRAWINGS

The above and other aspects, features and advantages of the present inventive concepts will be more clearly understood from the following detailed description taken in conjunction with the accompanying drawings, in which.

DETAILED DESCRIPTION

Figure 1:
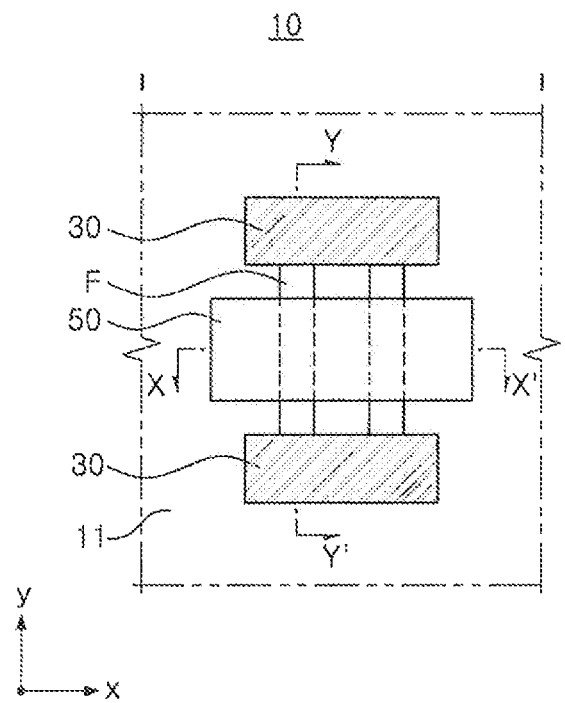
FIG. 1 is a plan view illustrating a semiconductor device according to example embodiments of the present inventive concepts.

Example embodiments of the present inventive concepts will now be described in detail with reference to the accompanying drawings.

Various embodiments will now be described more fully with reference to the accompanying drawings in which some embodiments are shown. The present disclosure may, however, be embodied in different forms and should not be construed as limited to the embodiments set forth herein. Rather, these embodiments are provided so that this disclosure is thorough and complete and fully conveys the present disclosure to those skilled in the art. In the drawings, the sizes and relative sizes of layers and regions may be exaggerated for clarity.

It will be understood that when an element or layer is referred to as being "on," "connected to," or "coupled to" another element or layer, it can be directly on, connected or coupled to the other element or layer or intervening elements or layers may be present. In contrast, when an element is referred to as being "directly on," "directly connected to," or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper" and the like, may be used herein for ease of description to describe the relationship of one element or feature to another element(s) or feature(s) as illustrated in the figures. It will be understood that spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Example embodiments of aspects of the present inventive concepts explained and illustrated herein include their complementary counterparts.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

The terminology used herein is for the purpose of describing particular embodiments only and is not intended to be limiting of the present disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Meanwhile, when an embodiment can be implemented differently, functions or operations described in a particular block may occur in a different way from a flow described in the flowchart. For example, two consecutive blocks may be performed simultaneously, or the blocks may be performed in reverse according to related functions or operations.

Figure 2:
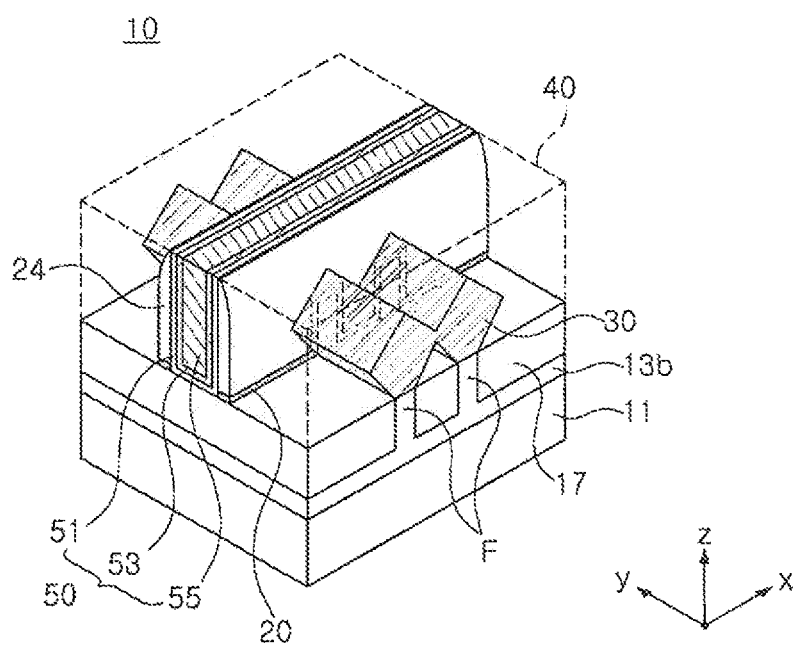
FIG. 2 a perspective view illustrating a semiconductor device according to example embodiments of the present inventive concepts.
Figure 3:
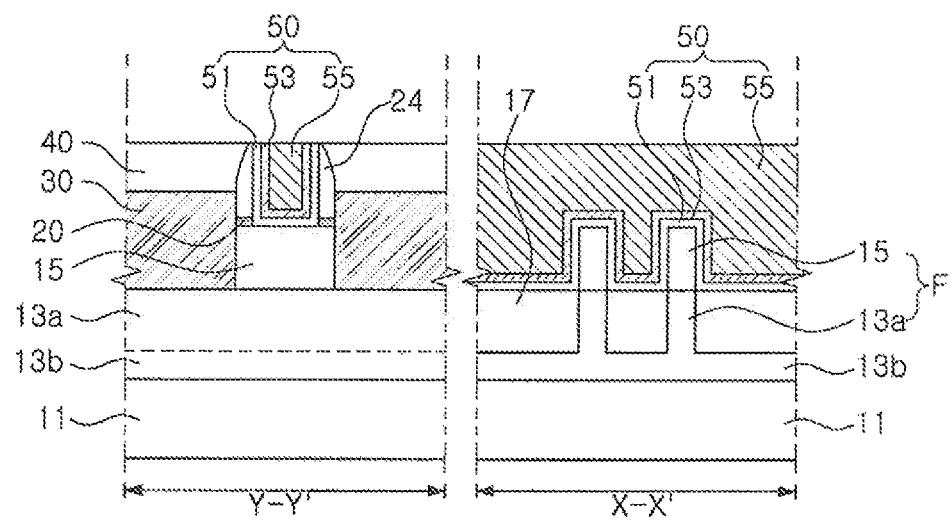
FIG. 3 is a cross-sectional view illustrating cross sections of a semiconductor device according to example embodiments of the present inventive concepts, taken along lines X-X' and Y-Y' of FIG. 1.

FIG. 1 is a plan view illustrating a semiconductor device according to example embodiments of the present inventive concepts. FIG. 2 is a perspective view illustrating a semiconductor device according to example embodiments of the present inventive concepts. FIG. 3 is a cross-sectional view illustrating cross sections of a semiconductor device according to example embodiments of the present inventive concepts, taken along lines X-X' and Y-Y' of FIG. 1.

Referring to FIG. 1, a semiconductor device 10 according to example embodiments of the present inventive concepts may include a substrate 11, active fins F, a gate structure 50 intersecting the active fins F, and source/drain structures 30. The semiconductor device 10 may be provided as a P-type fin field effect transistor (FinFET).

Referring to FIGS. 2 and 3, the semiconductor device 10 according to example embodiments of the present inventive concepts may include a lower buffer layer 13b formed on the substrate 11, the active fins F formed on the lower buffer layer 13b, an isolation layer 17 formed between the active fins F, and the gate structure 50 formed to intersect the active fins F on the active fins F. The semiconductor device 10 may further include sidewall spacers 24 formed on both sidewalls of the gate structure 50, the source/drain structures 30 formed on both sides of the gate structure 50, and an inter-layer insulation layer 40 formed on the source/drain structures 30 and the isolation layer 17. The semiconductor device 10 may further include a capping layer 20 formed between the sidewall spacers 24 and a channel layer 15. The capping layer 20 may extend along the gate structure 50 while covering the channel layer 15. The capping layer 20 may be also formed between the sidewall spacers 24 and the isolation layer 17. The capping layer 20 may be disposed to contact lower surfaces of the sidewall spacers 24, and have a width substantially the same as a width of the lower surfaces of the sidewall spacers 24.

The active fins F may protrude from the lower buffer layer 13b and extend in a first direction (e.g. a y-direction). The gate structure 50 may extend in a second direction (e.g. an x-direction) intersecting the first direction. The first direction and the second direction may be substantially perpendicular to each other. The gate structure 50 may be formed to cover an upper portion of the active fins F, for example, the channel layer 15.

The active fins F may include an upper buffer layer 13a and the channel layer 15. The lower buffer layer 13b disposed below the upper buffer layer 13a may be commonly connected to lower portions of the active fins F.

A lattice constant of the lower buffer layer 13b may be higher than a lattice constant of the substrate 11. A lattice constant of the upper buffer layer 13a may be equal to the lattice constant of the lower buffer layer 13b. According to some embodiments of the present inventive concepts, the lattice constant of the upper buffer layer 13a may be higher than the lattice constant of the lower buffer layer 13b. The lattice constant of the channel layer 15 may be higher than the lattice constant of the upper buffer layer 13a. Thus, the upper buffer layer 13a may cause a compressive strain in the channel layer 15 disposed on the upper buffer layer 13a. As a result, hole mobility in the channel layer 15 may be increased.

The substrate 11 may be provided as a semiconductor substrate. The substrate 11 may be provided as a silicon substrate or a silicon-on-insulator (SOI) substrate.

The upper buffer layer 13a and the lower buffer layer 13b may be formed of a silicon-germanium compound. According to example embodiments of the present inventive concepts, the upper buffer layer 13a may be formed of a material having the same composition as a composition of a material forming the lower buffer layer 13b. On the other hand, a germanium content in the upper buffer layer 13a may be higher than a germanium content in the lower buffer layer 13b. The germanium content may gradually increase as a distance increases from a lower surface of the lower buffer layer 13b to an upper surface of the upper buffer layer 13a.

The channel layer 15 may be formed of a silicon-germanium compound. A germanium content in the channel layer 15 may be higher than the germanium content in the upper buffer layer 13a. According to example embodiments of the present inventive concepts, the channel layer 15 may include a central portion and a surface portion, with the surface portion having a germanium content higher than a germanium content in the central portion. The germanium content may gradually increase as a distance increases from the central portion to the surface portion of the channel layer 15.

An oxidation rate of a silicon-germanium compound may increase as the germanium content therein increases. Thus, an oxidation rate of the channel layer 15 having a relatively higher germanium content may be faster than an oxidation rate of the upper buffer layer 13a. Due to the oxidation, a surface of the channel layer 15 may be lost and/or damaged. In a case in which such a phenomenon gets worse, a compressive strain in the channel layer 15 may be relieved, and thus, the hole mobility may be decreased. Thus, according to example embodiments of the present inventive concepts, the damage to the channel layer 15 may be reduced, and the deterioration of device characteristics may be reduced or prevented, by disposing the capping layer 20, formed of a material able to prevent oxygen from being diffused, on the channel layer 15 so that the channel layer 15 is not oxidized in a subsequent process.

The capping layer 20 may be disposed to cover the channel layer 15. The capping layer 20 may be formed of the material able to prevent oxygen from being diffused into the channel layer 15. The capping layer 20 may include any one of SiN, SiCN, and combinations thereof. The capping layer 20 on the channel layer 15 may be partially removed in a subsequent process, to remain between the sidewall spacers 24 and the channel layer 15, as illustrated in FIG. 2 and FIG. 3. The capping layer 20 may also remain between the sidewall spacers 24 and the isolation layer 17. The capping layer 20 may be disposed to contact the lower surfaces of the sidewall spacers 24, and have the width substantially the same as the width of the lower surfaces of the sidewall spacers 24.

The isolation layer 17 may be formed between the active fins F. The isolation layer 17 may be formed to cover a lower portion of the active fins F and expose the channel layer 15 of the active fins F. According to example embodiments of the present inventive concepts, the isolation layer 17 may be formed such that an upper surface of the isolation layer 17 may be at substantially the same height as a height of an upper surface of the upper buffer layer 13a. In some example embodiments of the present inventive concepts, the isolation layer 17 may be formed such that the upper surface of the isolation layer 17 may be at a height different from the height of the upper surface of the upper buffer layer 13a.

The source/drain structures 30 may be disposed on both sides of the channel layer 15. The source/drain structures 30 may be formed in a recess from which the channel layer 15 has been removed, along the side surfaces of the sidewall spacers 24. A lower surface of the recess may be at substantially the same height as the height of the upper surface of the upper buffer layer 13a. In some embodiments of the present inventive concepts, the source/drain structures 30 may be formed in a recess from which the channel layer 15 and a portion of the upper buffer layer 13a have been removed. According to example embodiments of the present inventive concepts, the source/drain structures 30 may be formed in a recess from which a portion of the channel layer 15 has been removed. The source/drains 30 may be provided as elevated source/drain structures such that an upper surface of the source/drain structures 30 may be at a height higher than a height of an upper surface of the channel layer 15. The source/drain structures 30 may be formed of a silicon-germanium compound, and may have a germanium content higher than a germanium content in the channel layer 15.

The gate structure 50 may be disposed on the active fins F while intersecting the active fins F. The gate structure 50 may include a gate insulation layer 51, a lower gate electrode 53, and an upper gate electrode 55. The gate insulation layer 51 may contain, for example, a silicon oxide, a silicon nitride, and/or a high-K material. The high-K material may contain, for example, $HfO_2$, $ZrO_2$ $Al_2O_3$, and/or $Ta_2O_5$. The lower gate electrode 53 may include, for example, a metal nitride such as TiN, TaN, TiAlN, and/or WN. The upper gate electrode 55 may include, for example, a metal material such as Ti, Ta, Al, Mo, and/or W.

Figure 4:
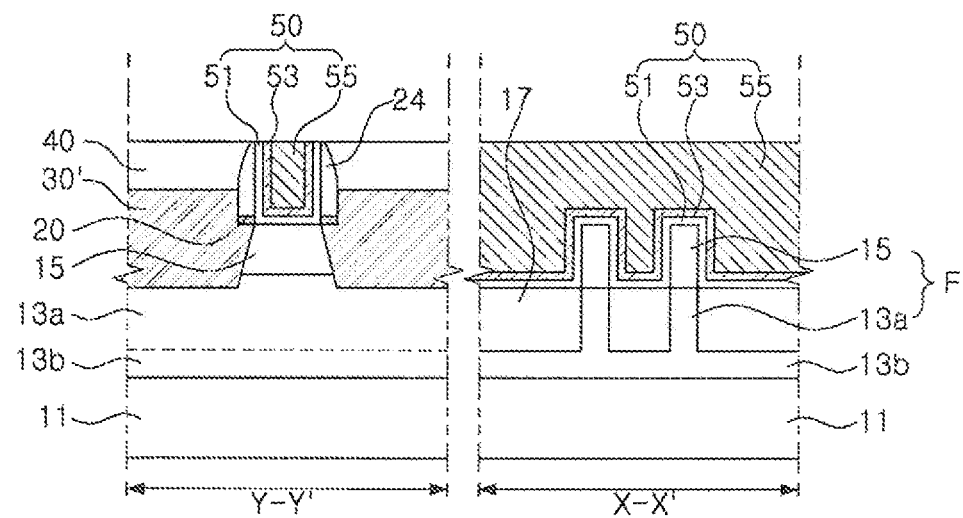
FIG. 4 is a cross-sectional view illustrating cross sections of a semiconductor device according to example embodiments of the present inventive concepts.

FIG. 4 is a cross-sectional view illustrating cross sections of a semiconductor device according to example embodiments of the present inventive concepts.

In detail, FIG. 4 is the cross-sectional view illustrating cross sections of a semiconductor device including source/drain structures 30' having a structure different from a structure of the source/drain structures 30 of the semiconductor device 10 described with reference to FIG. 2 and FIG. 3. FIG. 3 is a cross-sectional view illustrating cross sections of the semiconductor device 10 of FIG. 1 taken along lines X-X' and Y-Y'. Descriptions provided above will be omitted, and elements not described above will be described below.

Referring to FIG. 4, the source/drain structures 30' disposed on both sides of a channel layer IS may have a structure including a protruding portion projecting downwardly from sidewall spacers 24. Sidewalls of the channel layer 15 are illustrated as being inclined, but are not limited thereto. Thus, a capping layer 20 may be disposed between a lower surface of the sidewall spacers 24 and the protruding portion of the source/drain structures 30'. The capping layer 20 may be disposed to contact the lower surfaces of the sidewall spacers 24, and have a width substantially the same as a width of the lower surfaces of the sidewall spacers 24.

Figure 5:
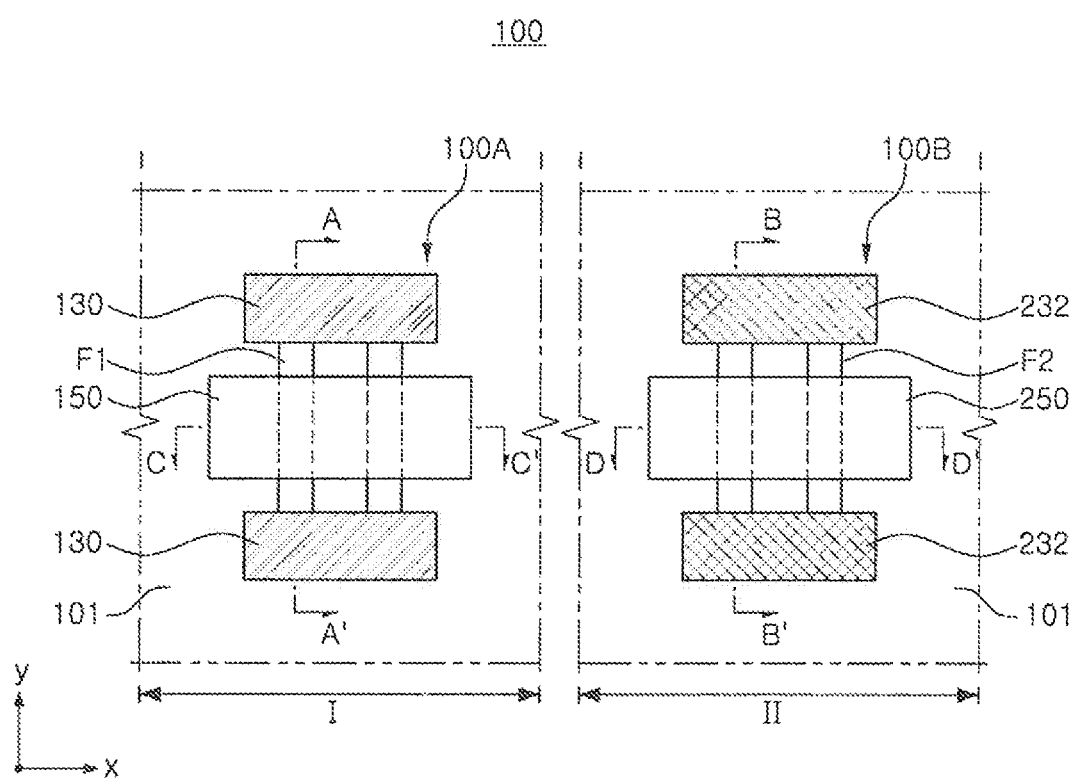
FIG. 5 is a plan view illustrating a semiconductor device according to example embodiments of the present inventive concepts.
Figure 6:
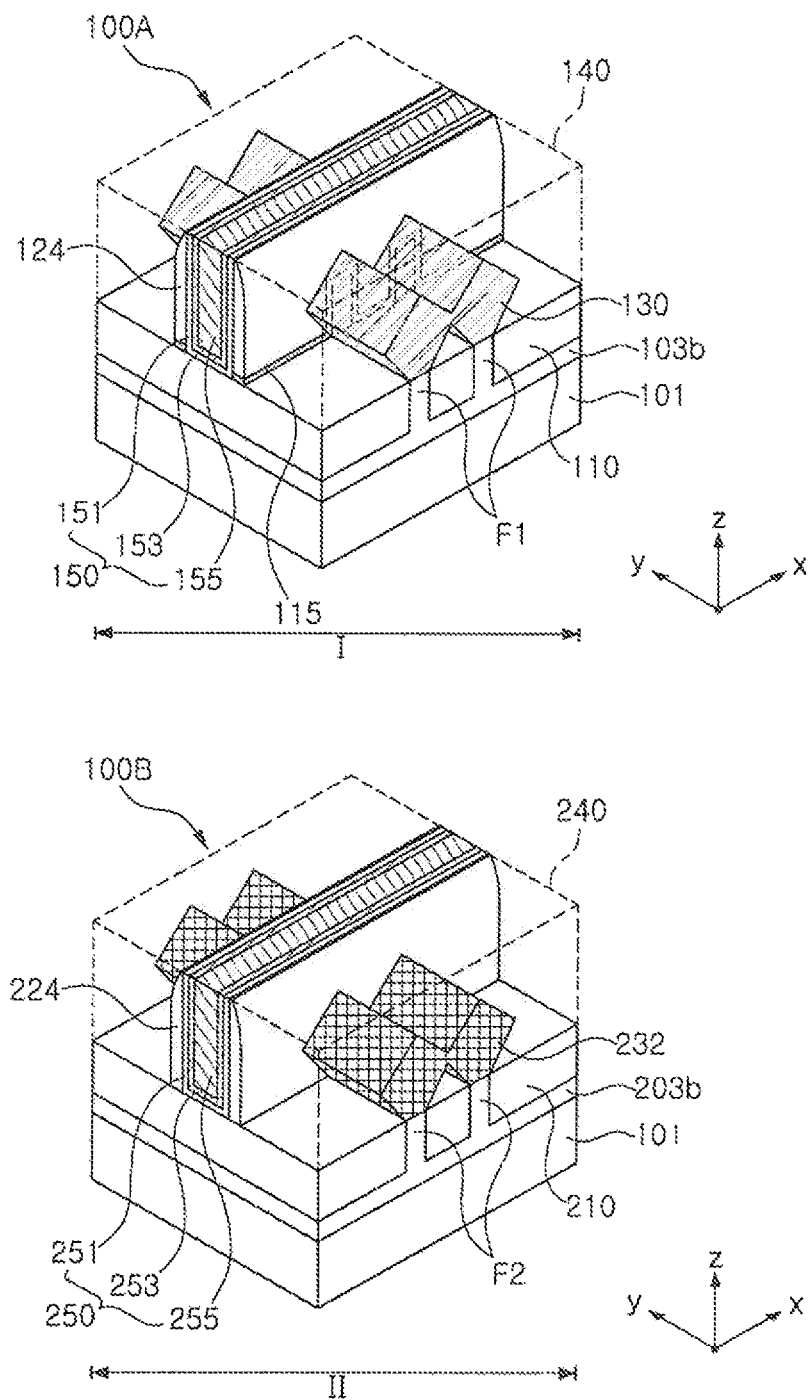
FIG. 6 is a perspective view illustrating a semiconductor device according to example embodiments of the present inventive concepts.
Figure 7A:
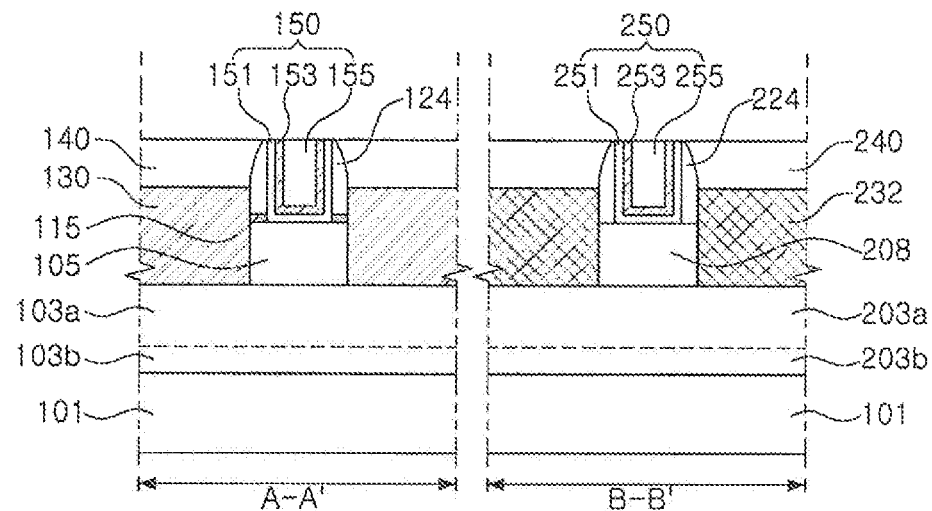
FIG. 7A is a cross-sectional view illustrating cross sections of a semiconductor device according to example embodiments of the present inventive concepts, taken along lines A-A' and B-B' of FIG. 6.
Figure 7B:
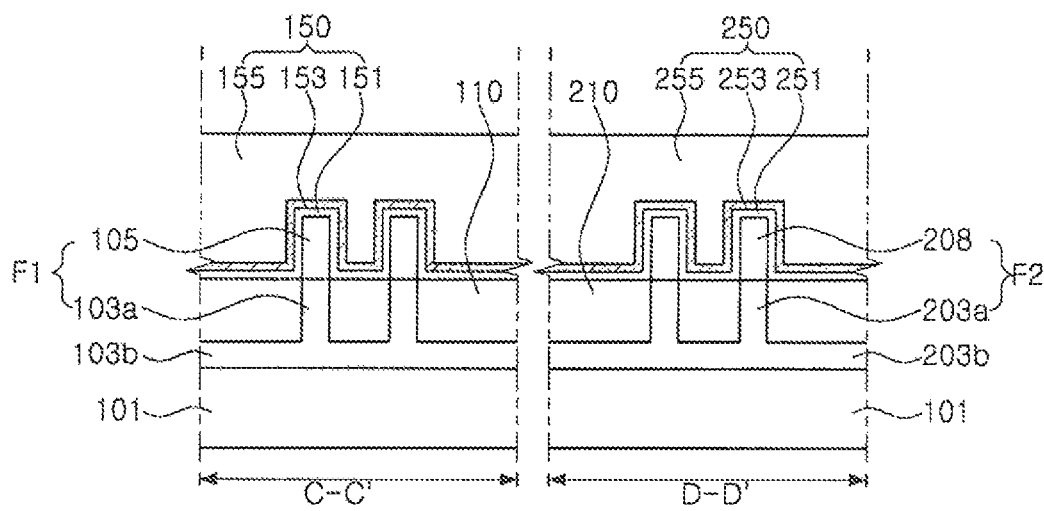
FIG. 7B is a cross-sectional view illustrating cross sections of a semiconductor device according to example embodiments of the present inventive concepts, taken along lines C-C' and D-D' of FIG. 6.

FIG. 5 is a plan view illustrating a semiconductor device according to example embodiments of the present inventive concepts. FIG. 6 is a perspective view illustrating a semiconductor device according to example embodiments of the present inventive concepts. FIG. 7A is a cross-sectional view illustrating cross sections of the semiconductor device of FIG. 5 taken along lines A-A' and B-B'. FIG. 7B is a cross-sectional view illustrating cross-sections of the semiconductor device of FIG. 5 taken along lines C-C' and D-D'.

Referring to FIG. 5, a semiconductor device 100 may include a substrate 101 having a first region I and a second region II, a first transistor 100A formed in the first region I, and a second transistor 100B formed in the second region II. The first region I may be provided as an N-well region doped with an N-type impurity, and the second region II may be provided as a P-well region doped with a P-type impurity. The first transistor 100A may be provided as a P-type field effect transistor, and the second transistor 100B may be provided as an N-type field effect transistor. The first transistor 100A and the second transistor 100B may be provided as fin field effect transistors (FinFET).

The first transistor 100A may include first active fins F1, a first gate structure 150 intersecting the first active fins F1, and first source/drain structures 130 disposed on both sides of the first gate structure 150. The second transistor 100B may include second active fins F2, a second gate structure 250 intersecting the second active fins F2, and second source/drain structures 232 disposed on both sides of the second gate structure 250.

Referring to FIGS. 6, 7A, and 7B, the first transistor 100A formed in the first region I of the semiconductor device 100 according to example embodiments of the present inventive concepts may include a first lower buffer layer 103b formed on the substrate 101, the first active fins F1 formed on the first lower buffer layer 103b, and the first gate structure 150 formed on the first active fins F1. The first transistor 100A may further include first sidewall spacers 124 formed on both sidewalls of the first gate structure 150 and first source/drain structures 130 formed on both sides of the first gate structure 150. The first transistor 100A may further include a first inter-layer insulation layer 140 formed on the first source/drain structures 130 and a first isolation layer 110. The first transistor 100A may further include a capping layer 115 formed between the first sidewall spacers 124 and a first channel layer 105. The capping layer 115 may be also formed between the first sidewall spacers 124 and the first isolation layer 110.

The first active fins F1 may protrude from the first lower buffer layer 103b and extend in a first direction (e.g. a y-direction). The first gate structure 150 may extend in a second direction (e.g. an x-direction) intersecting the first direction. The first gate structure 150 may be formed to cover upper portions of the first active fins F1.

The first active fins F1 may include a first upper buffer layer 103a and the first channel layer 105. The first lower buffer layer 103b disposed below the first upper buffer layer 103a may be commonly connected to lower portions of the first active fins F1.

A lattice constant of the first lower buffer layer 103b may be higher than a lattice constant of the substrate 101. A lattice constant of the first upper buffer layer 103a may be equal to the lattice constant of the first lower buffer layer 103b. In some embodiments of the present inventive concepts, the lattice constant of the first upper buffer layer 103a may be higher than the lattice constant of the first lower buffer layer 103b. A lattice constant of the first channel layer 105 may be higher than the lattice constant of the first upper buffer layer 103a. Thus, the first upper buffer layer 103a may cause a compressive strain in the first channel layer 105 disposed on the upper buffer layer 103a. As a result, hole mobility in the first channel layer 105 may be increased.

The substrate 101 may be provided as a semiconductor substrate. The substrate 101 may be provided as a silicon substrate or a silicon-on-insulator (SOI) substrate.

The first upper buffer layer 103a and the first lower buffer layer 103b may be formed of a silicon-germanium compound. According to example embodiments of the present inventive concepts, the first upper buffer layer 103a may be formed of a material having the same composition as a composition of a material forming the first lower buffer layer 103b. In some embodiments of the present inventive concepts, a germanium content in the first upper buffer layer 103a may be higher than a germanium content in the first lower buffer layer 103b. The germanium content may gradually increase as a distance increases from a lower surface of the first lower buffer layer 103b to an upper surface of the first upper buffer layer 103a.

The first channel layer 105 may be formed of a silicon-germanium compound. A germanium content in the first channel layer 105 may be higher than the germanium content in the first upper buffer layer 103a. The first channel layer 105 may include a central portion and a surface portion having a germanium content higher than a germanium content in the central portion. According to example embodiments of the present inventive concepts, the germanium content may gradually increase as a distance increases from the central portion to the surface portion of the first channel layer 105.

An oxidation rate of a silicon-germanium compound may increase as the germanium content therein increases. Thus, an oxidation rate of the first channel layer 105 having a relatively higher germanium content may be faster than an oxidation rate of the first upper buffer layer 103a. Due to the oxidation, a surface of the first channel layer 105 may be lost and/or damaged. In a case in which such a phenomenon gets worse, a compressive strain in the first channel layer 105 may be relieved, and thus, the electron hole mobility may be decreased. Thus, according to example embodiments of the present inventive concepts, the damage to the first channel layer 105 may be reduced, and the deterioration of device characteristics may be prevented or reduced, by disposing the capping layer 115, formed of a material able to prevent the first channel layer 105 from being oxidized in a subsequent process, on the first channel layer 105. The capping layer 115 may include any one of SiN, SiCN, and combinations thereof.

The capping layer 115 on the first channel layer 105 may be partially removed in a subsequent process, to remain between the first sidewall spacers 124 and the first channel layer 105, as illustrated in FIG. 6 and FIG. 7A. The capping layer 115 may also remain between the first sidewall spacers 124 and the first isolation layer 110. The capping layer 115 may extend along the first gate structure 150 while intersecting the first channel layer 105.

The first isolation layer 110 may be formed between the first active fins F1. The first isolation layer 110 may be formed such that upper portions of the first active fins F1 are protruded over an upper surface of the first isolation layer 110. According to example embodiments of the present inventive concepts, the first isolation layer 110 may be formed such that an upper surface of first isolation layer 110 may be at substantially the same height as a height of an upper surface of the first upper buffer layer 103a. In some embodiments of the present inventive concepts, the first isolation layer 110 may be formed such that the upper surface of the first isolation layer 110 may be at a height different from the height of the upper surface of the first upper buffer layer 103a.

The first source/drain structures 130 may be disposed on both sides of the first channel layer 105. The first source/drain structures 130 may be formed in a first fin recess from which the first channel layer 105 has been removed, along the side surfaces of the first sidewall spacers 124. A lower surface of the first fin recess may be at substantially the same height as the height of the upper surface of the first upper buffer layer 103a. In some embodiments of the present inventive concepts, the first source/drain structures 130 may be formed in a first fin recess from which the first channel layer 105 and a portion of the first upper buffer layer 103a have been removed. According to example embodiments of the present inventive concepts, the first source/drain structures 130 may be formed in a first fin recess from which a portion of the first channel layer 105 has been removed. The first source/drains 130 may be provided as elevated source/drain structures such that an upper surface of the first source/drain structures 130 may be at a height higher than a height of an upper surface of the first channel layer 105. The first source/drain structures 130 may be formed of a silicon-germanium compound, and have a germanium content higher than a germanium content in the first channel layer 105. The first source/drain structures 130 may be doped with a P-type impurity.

The first gate structure 150 may be disposed on the first active fins F1 while intersecting the first active fins F1. The first gate structure 150 may include a first gate insulation layer 151, a first lower gate electrode 153, and a first upper gate electrode 155. The first gate insulation layer 151 may contain a silicon oxide, a silicon nitride, or a high-K material. The high-K material may contain, for example, $HfO_2$, $ZrO_2$ $Al_2O_3$, and/or $Ta_2O_5$. The first lower gate electrode 153 may include, for example, a metal nitride such as TiN, TaN, TiAlN, and/or WN. The first upper gate electrode 155 may include, for example, a metal material such as Ti, Ta, Al, Mo, and/or W.

Referring to FIGS. 6, 7A, and 7B again, a second transistor 100B formed in a second region II of the semiconductor device 100 may include a second lower buffer layer 203b formed on the substrate 101, second active fins F2 formed on the second lower buffer layer 203b, and a second gate structure 250 formed on the second active fins F2. The second transistor 100B may further include second sidewall spacers 224 formed on both sidewalls of the second gate structure 250, and second source/drain structures 232 formed on both sides of the second gate structure 250. The second transistor 100B may further include a second interlayer insulation layer 240 formed on the second source/drain structures 232 and a second isolation layer 210.

The second active fins F2 may protrude from the second lower buffer layer 203b and extend in a first direction (e.g. a y-direction). The second gate structure 250 may extend in a second direction (e.g. an x-direction) intersecting the first direction. The second gate structure 250 may be formed to cover upper portions of the second active fins F2.

The second active fins F2 may include an upper buffer layer 203a and a second channel layer 208. The second lower buffer layer 203b disposed below the second upper buffer layer 203a may be commonly connected to lower portions of the second active fins F2.

A lattice constant of the second lower buffer layer 203b may be higher than a lattice constant of the substrate 101. A lattice constant of the second upper buffer layer 203a may be equal to the lattice constant of the second lower buffer layer 203b. In some embodiments of the present inventive concepts, the lattice constant of the second upper buffer layer 203a may be lower than the lattice constant of the second lower buffer layer 203b. A lattice constant of the second channel layer 208 may be lower than the lattice constant of the second upper buffer layer 203a. Thus, the second upper buffer layer 203a may cause a tensile strain in the second channel layer 208 disposed on the second upper buffer layer 203a. As a result, electron mobility in the second channel layer 208 may be increased.

The substrate 101 may be provided as a semiconductor substrate. The substrate 101 may be provided as a silicon substrate or a silicon-on-insulator (SOI) substrate.

The second upper buffer layer 203a and the second lower buffer layer 203b may be formed of a silicon-germanium compound. According to example embodiments of the present inventive concepts, the second upper buffer layer 203a may be formed of a material having substantially the same composition as a composition of a material forming the second lower buffer layer 203b. On the other hand, a germanium content in the second upper buffer layer 203a may be lower than a germanium content in the second lower buffer layer 203b. The germanium content may gradually decrease as a distance increases from a lower surface of the second lower buffer layer 203b to an upper surface of the second upper buffer layer 203a. The second upper buffer layer 203a and the second lower buffer layer 203b may be formed of a silicon-germanium compound having substantially the same composition as a composition of a silicon-germanium compound forming the first upper buffer layer 103a and the first lower buffer layer 103b.

The second channel layer 208 may be formed of silicon or a silicon-germanium compound having a germanium content lower than a germanium content in the second upper buffer layer 203a.

The second isolation layer 210 may be formed between the second active fins F2. The second isolation layer 210 may be formed such that upper portions of the second active fins F2 are protruded over an upper surface of the first isolation layer 210. According to example embodiments of the present inventive concepts, the second isolation layer 210 may be formed such that an upper surface of the second isolation layer 210 may be at substantially the same height as a height of an upper surface of the second upper buffer layer 203a. In some embodiments of the present inventive concepts, the upper surface of the second isolation layer 210 may be at a height different from the height of the upper surface of the second upper buffer layer 203a.

The second source/drain structures 232 may be disposed on both sides of the second channel layer 208. The second source/drain structures 232 may be formed in a second fin recess from which the second channel layer 208 has been removed, along side surfaces of the second sidewall spacers 224. A lower surface of the second fin recess may be formed to be at substantially the same height as the height of the upper surface of the second upper buffer layer 203a. In some embodiments of the present inventive concepts, the second source/drain structures 232 may be formed in a second fin recess from which the second channel layer 208 and a portion of the second upper buffer layer 203a have been removed. According to example embodiments of the present inventive concepts, the second source/drain structures 232 may be formed in a second fin recess from which a portion of the second channel layer 208 has been removed. The second source/drains 232 may be provided as elevated source/drain structures such that an upper surface of the second source/drain structures 232 may be at a height higher than a height of an upper surface of the second channel layer 208. The second source/drain structures 232 may be formed of silicon. The second source/drain structures 232 may be doped with an N-type impurity.

The second gate structure 250 may be disposed on the second active fins F2 while intersecting the second active fins F2. The second gate structure 250 may include a second gate insulation layer 251, a second lower gate electrode 253, and a second upper gate electrode 255. The second gate insulation layer 251 may contain a silicon oxide, a silicon nitride, or a high-K material. The high-K material may contain, for example, $HfO_2$, $ZrO_2$ $Al_2O_3$, and/or $Ta_2O_5$. The second lower gate electrode 253 may include, for example, a metal nitride such as TiN, TaN, TiAlN, and/or WN. The second upper gate electrode 255 may include, for example, a metal material such as Ti, Ta, Al, Mo, and/or W.

FIGS. 8 through 16B are cross-sectional views illustrating a method of manufacturing a semiconductor device according to example embodiments of the present inventive concepts. The first region I and second region II described with respect to FIGS. 8 through 16B are as illustrated in FIG. 5.

Figure 8:
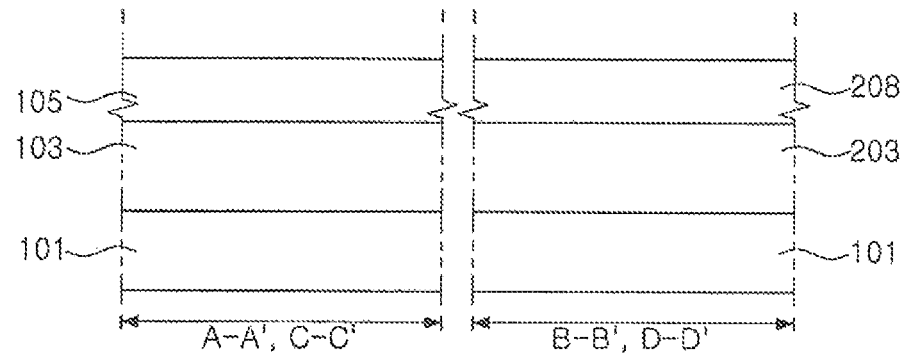
FIGS. 8 through 16B are cross-sectional views illustrating a method of manufacturing a semiconductor device according to example embodiments of the present inventive concepts.

Referring to FIG. 8, a first buffer layer 103 and a second buffer layer 203 may be formed on a substrate 101 including a first region I and a second region II. Subsequently, a first channel layer 105 may be formed on the first buffer layer 103, and a second channel layer 208 may be formed on the second buffer layer 203.

The substrate may be provided as, for example, a silicon substrate or a silicon-on-insulator (SOI) substrate. The first buffer layer 103 formed in the first region I and the second buffer layer 203 formed in the second region II may be formed of a material having a lattice constant higher than a lattice constant of a material forming the substrate 101. The first buffer layer 103 and the second buffer layer 203 may be formed of, for example, a silicon-germanium compound. The first buffer layer 103 and the second buffer layer 203 may be respectively formed of silicon-germanium compounds having equal compositions. The first buffer layer 103 may be doped with an N-type impurity, and the second buffer layer 203 may be doped with a P-type impurity.

The first buffer layer 103 and the second buffer layer 203 may be formed using an epitaxial growth process. The epitaxial growth process may be provided as a chemical vapor deposition (CVD) process or a molecular-beam epitaxy (MBE) process.

Subsequently, the first channel layer 105 may be formed on the first buffer layer 103, and the second channel layer 208 may be formed on the second buffer layer 203. The first channel layer 105 may be formed of a material having a lattice constant higher than a lattice constant of a material forming the first buffer layer 103, and the second channel layer 208 may be formed of a material having a lattice constant lower than a lattice constant of a material forming the second buffer layer 203. For example, the first channel layer 105 may be formed of a silicon-germanium compound having a germanium content higher than a germanium content in the first buffer layer 103, and the second channel layer 208 may be formed of silicon or a silicon-germanium compound having a germanium content lower than a germanium content in the second buffer layer 203. The first channel layer 105 may be doped with an N-type impurity, and the second channel layer 208 may be doped with a P-type impurity.

The first channel layer 105 and the second channel layer 208 may be formed using an epitaxial growth process. The epitaxial growth process may be provided as a chemical vapor deposition (CVD) process or a molecular-beam epitaxy (MBE) process. The first channel layer 105 and the second channel layer 208 may be formed respectively using separate epitaxial growth processes.

Figure 9A:
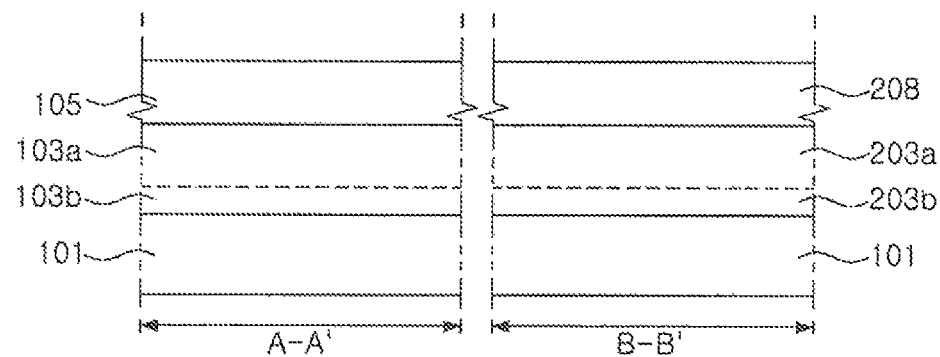
Figure 9B:
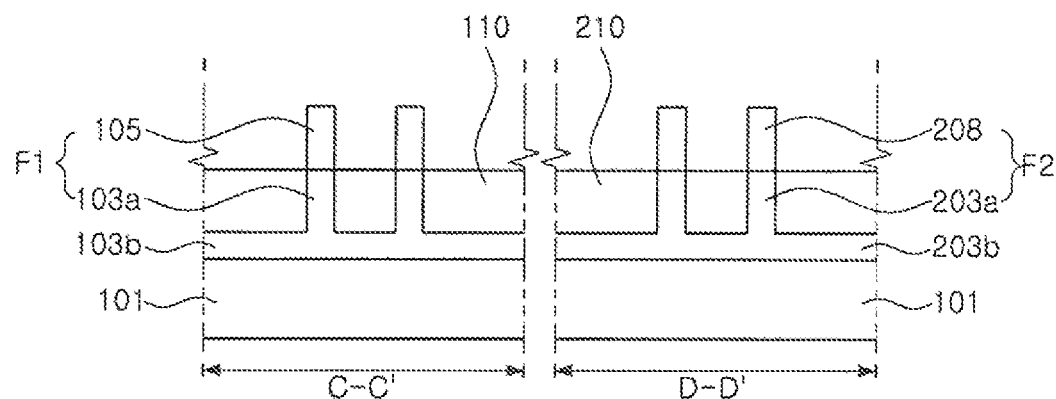

Referring to FIGS. 9A and 9B, first active fins F1 and second active fins F2 may be formed on the substrate 101 including the first region I and the second region II.

First, the first active fins F1 may be formed by anisotropically etching the first channel layer 105 and a portion of the first buffer layer 103 using a mask pattern in the first region I. The second active fins F2 may be formed by anisotropically etching the second channel layer 208 and a portion of the second buffer layer 203 using a mask pattern in the second region II. After the anisotropic etching process is completed, the first buffer layer 103 may be divided into a first upper buffer layer 103a and a first lower buffer layer 103b, and the second buffer layer 203 may be divided into a second upper buffer layer 203a and a second lower buffer layer 203b. The first upper buffer layer 103a and the first channel layer 105 may form the first active fins F1. The second upper buffer layer 203a and the second channel layer 208 may form the second active fins F2. According to example embodiments of the present inventive concepts, the first buffer layer 103 and the second buffer layer 203 may be anisotropically etched entirely such that the first lower buffer layer 103b and the second lower buffer layer 203b may not remain. The first active fins F1 and the second active fins F2 are illustrated as having shapes having constant widths, but the widths thereof may become narrower as a distance increases from a lower portion to an upper portion thereof in example embodiments of the present inventive concepts.

Subsequently, a trench between the first active fins F1 and a trench between the second active fins F2 may be filled with an insulation material, and then a flattening process may be conducted. The insulation material filling the trench may be partially removed, such that a first isolation layer 110 exposing an upper portion of the first active fins F1 and a second isolation layer 210 exposing an upper portion of the second active fins F2 may be formed. Heights of upper portions of the first isolation layer 110 and the second isolation layer 210 are illustrated so that the first channel layer 105 and the second channel layer 208 are entirely exposed, but are not limited thereto. The process in which the insulation material is removed may include a process in which the mask pattern is removed.

Figure 10A:
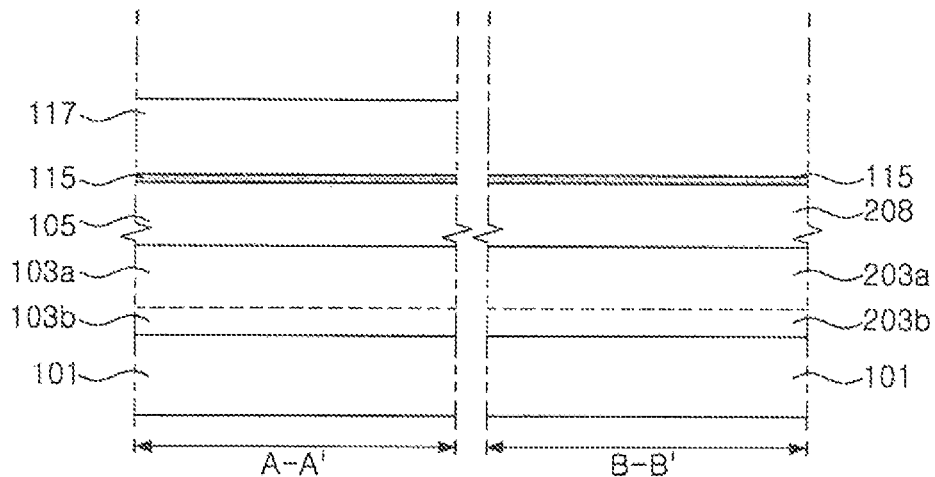
Figure 10B:
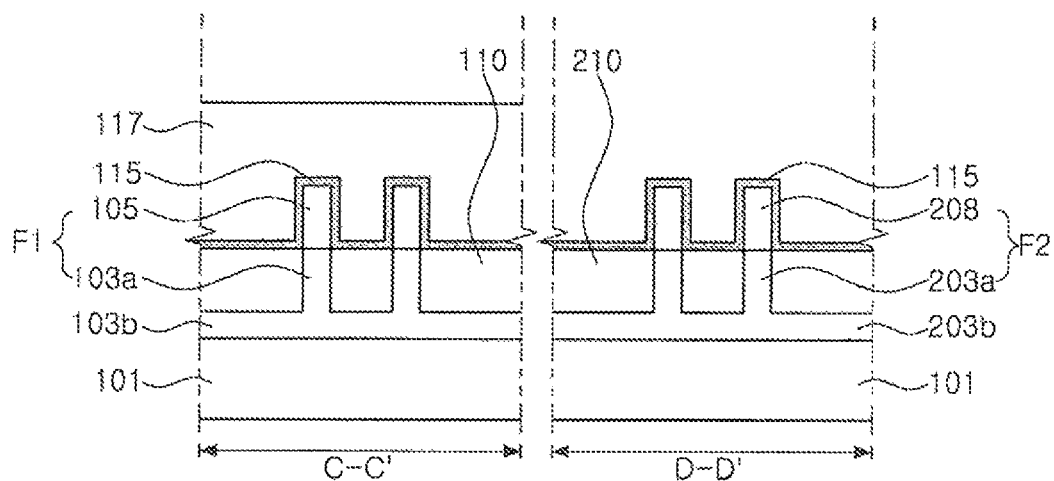

Referring to FIGS. 10A and 10B, a capping layer 115 conformally covering the first channel layer 105 and the second channel layer 208 may be formed in the first region I and the second region II. Subsequently, a protection pattern 117 covering the capping layer 115 may be formed in the first region I.

The capping layer 115 may be formed of a material able to prevent oxygen from being diffused. For example, the capping layer 115 may be formed of any one of SiN, SiCN, and combinations thereof. The protection pattern 117 may be formed of a material having an etching selectivity with respect to the capping layer 115. For example, the protection pattern 117 may be formed of a silicon oxide.

The capping layer 115 may be formed using, for example, an atomic layer deposition (ALD) process.

Figure 11A:
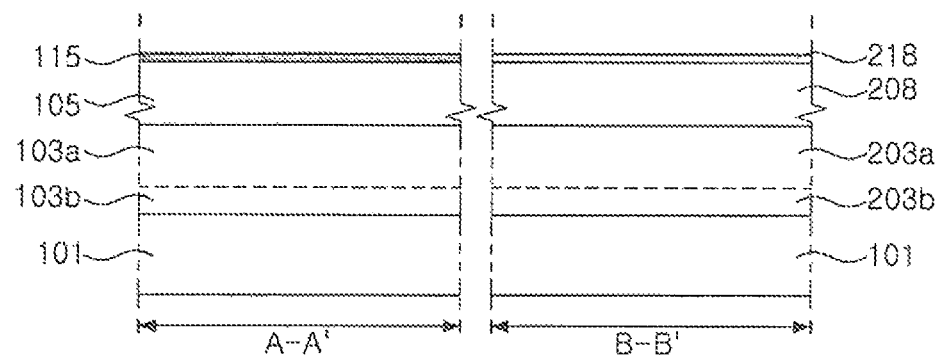
Figure 11B:
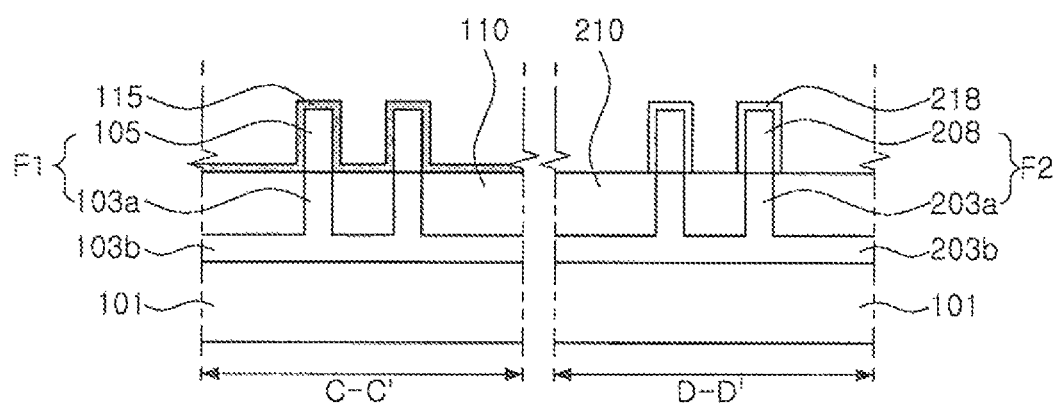

Referring to FIGS. 11A and 11B, a sacrificial oxidation layer 218 may be formed on the second channel layer 208 in the second region II.

First, a process in which the capping layer 115 on the second channel layer 208 in the second region is removed may be conducted. Subsequently, the substrate 101 may be heat-treated in an oxidation atmosphere, in order to form the sacrificial oxidation layer 218 on the second channel layer 208. In the heat-treatment process, a surface of the second channel layer 208 may be oxidized, such that the sacrificial oxidation layer 218 may be formed. For example, when the second channel layer 208 is formed of silicon, the sacrificial oxidation layer 218 may be formed of a silicon oxide. The heat-treatment process may be provided, for example, as a radical oxidation process or a thermal oxidation process. In the heat-treatment process, the first channel layer 105 in the first region may not be oxidized because the first channel layer 105 may be covered by the capping layer 115. However, a surface of the capping layer 115 may be partially oxidized. For example, when the capping layer 115 is formed of SiN, a SiON layer may be formed on the surface of the capping layer 115.

Figure 12A:
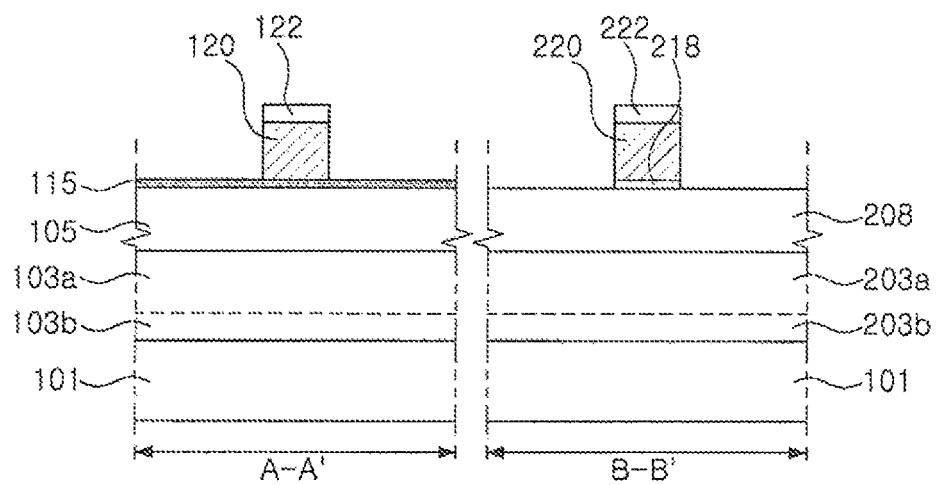
Figure 12B:
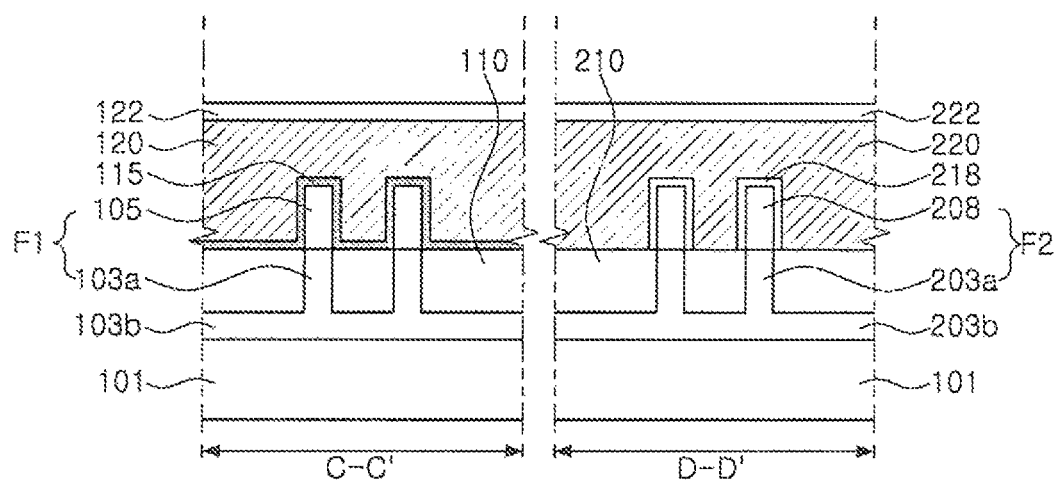

Referring to FIGS. 12A and 12B, a first sacrificial gate 120 and a second sacrificial gate 220 may be formed in the first region I and the second region II.

First, a sacrificial gate material may be deposited on the capping layer 115 in the first region I and on the sacrificial oxidation layer 218 in the second region II. Subsequently, a first gate mask pattern 122 may be formed on the sacrificial gate material in the first region I, and a second gate mask pattern 222 may be formed on the sacrificial gate material in the second region II. Next, the first sacrificial gate 120 and the second sacrificial gate 220 may be formed by anisotropically etching the sacrificial gate material using the first gate mask pattern 122 and the second gate mask pattern 222. Subsequently, the sacrificial oxidation layer 218 may be partially removed from the second region II by conducting a cleaning process in which a by-product of the etching may be removed. In detail, a portion of the sacrificial oxidation layer 218 not disposed below the second sacrificial gate 220 may be removed.

The first sacrificial gate 120 and the second sacrificial gate 220 may be formed in positions corresponding to a first gate structure 150 and a second gate structure 250 (see FIG. 7A), and removed in a subsequent process. The first sacrificial gate 120 and the second sacrificial gate 220 may include, for example, polysilicon.

Figure 13A:
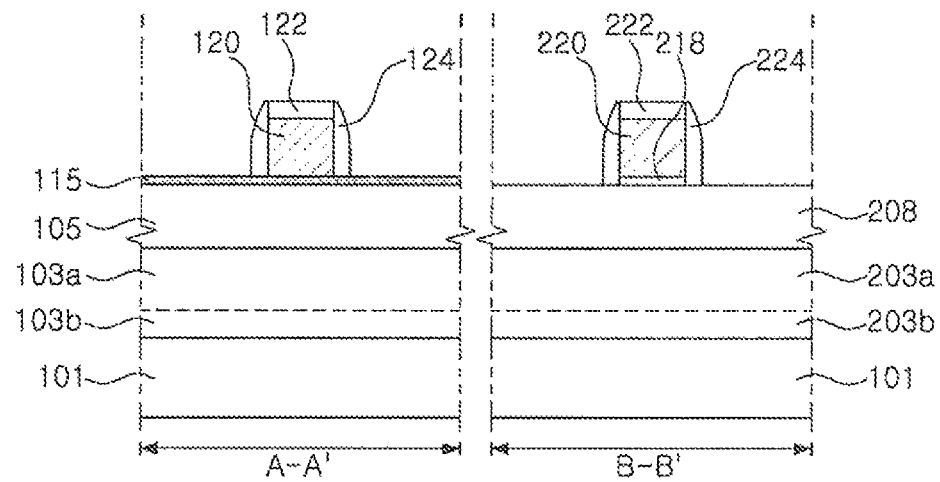
Figure 13B:
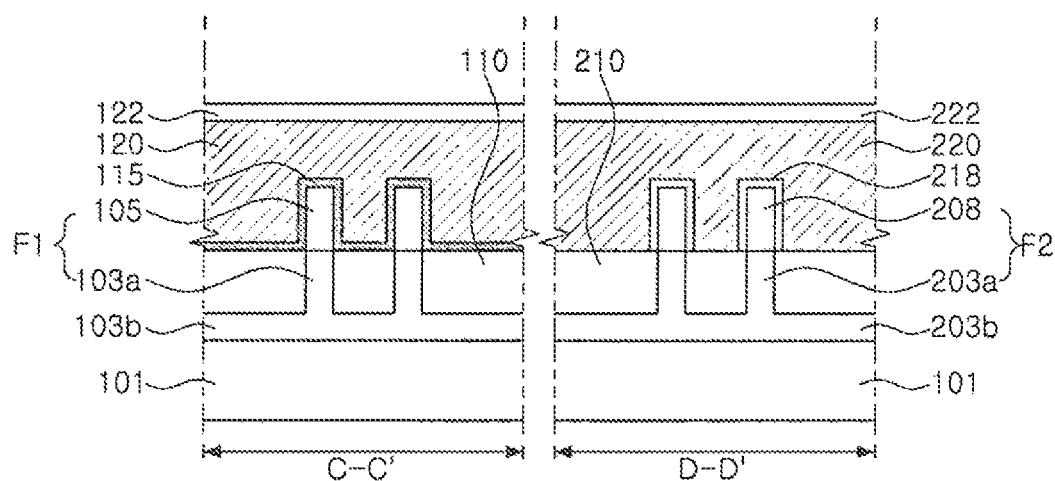

Referring to FIGS. 13A and 13B, first sidewall spacers 124 and second sidewall spacers 224 may be formed respectively in the first region I and the second region II.

First, spacer insulation films having constant thicknesses may be formed to cover the first sacrificial gate 120 and the second sacrificial gate 220. Then, the first sidewall spacers 124 may be formed on both sidewalls of the first sacrificial gate 120, and the second sidewall spacers 224 may be formed on both sidewalls of the second sacrificial gate 220, by conducting an anisotropic etching process. The first sidewall spacers 124 may be formed on the capping layer 115, and the second sidewall spacers 224 may be formed on the second channel layer 208. The first and second sidewall spacers 124 and 224 may be formed, for example, of a silicon oxide, a silicon nitride, or combinations thereof.

Figure 14A:
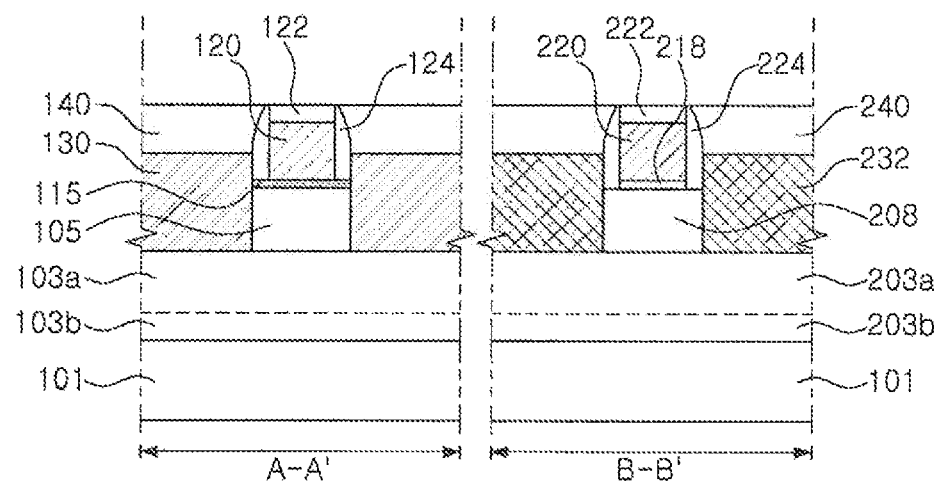
Figure 14B:
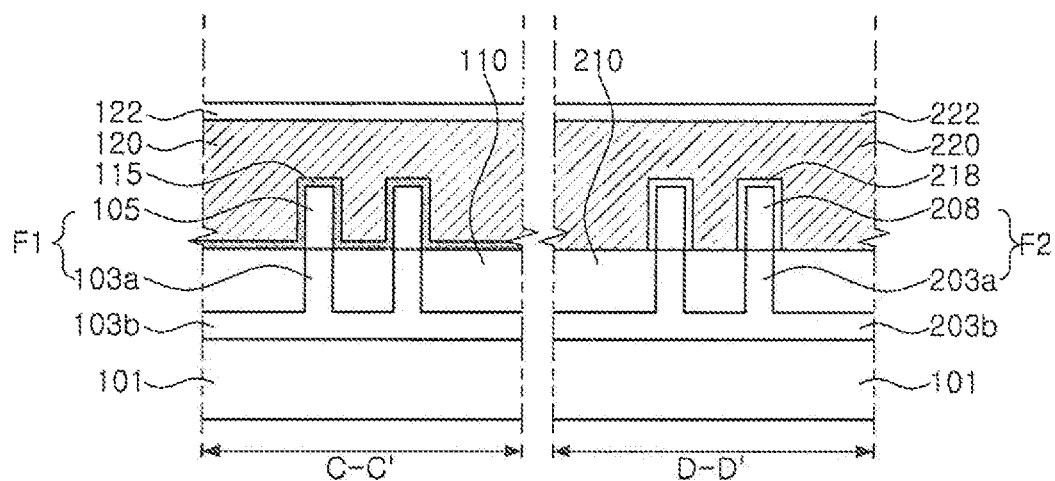

Referring to FIGS. 14A and 14B, first source/drain structures 130 and second source/drain structures 232 may be formed respectively in the first region I and the second region II, and a first inter-layer insulation layer 140 and a second inter-layer insulation layer 240 may be formed respectively in the first region I and the second region II.

First fin recesses may be formed on both sides of the first channel layer 105 by etching a portion of the capping layer 115 and a portion of the first channel layer 105 along sidewalls of the first sidewall spacers 124, using the first gate mask pattern 122 and the first sidewall spacers 124 as an etching mask. An epitaxial layer may be grown in the first fin recesses by conducting a selective epitaxial growth (SEG) process, to form the first source/drain structures 130. The first source/drain structures 130 may be provided as elevated source/drain structures, of which an upper surface may be at a height higher than a height of an upper surface of the first channel layer 105. The first source/drain structures 130 may be formed of, for example, a silicon-germanium compound, and doped with a P-type impurity. The first source/drain structures 130 may be doped with the P-type impurity in-situ in the selective epitaxial growth process. In example embodiments of the present inventive concepts, the first fin recesses are illustrated as being formed at substantially the same position as a position of an upper surface of the first upper buffer layer 103a, but the present inventive concepts are not limited thereto.

Second fin recesses may be formed on both sides of the second channel layer 208 by etching a portion of the second channel layer 208 along sidewalls of the second sidewall spacers 224, using the second gate mask pattern 222 and the second sidewall spacers 224 as an etching mask. An epitaxial layer may be grown in the second fin recesses by conducting a selective epitaxial growth (SEG) process, to form the second source/drain structures 232. The second source/drain structures 232 may be provided as elevated source/drain structures, of which an upper surface may be at a height higher than a height of an upper surface of the second channel layer 208. The second source/drain structures 232 may be formed of, for example, silicon, and doped with an N-type impurity. The second source/drain structures 232 may be doped with the N-type impurity in situ in the selective epitaxial growth process. In example embodiments of the present inventive concepts, the second fin recesses are illustrated as being formed at substantially the same position as a position of an upper surface of the second upper buffer layer 203a, but the present inventive concepts are not limited thereto.

Subsequently, insulation materials covering the first and second sidewall spacers 124 and 224 and the first and second source/drain structures 130 and 232 may be formed, and then a flattening process may be conducted so that upper surfaces of the first and second gate mask patterns 122 and 222 are exposed, to form the first and second inter-layer insulation layers 140 and 240.

Figure 15A:
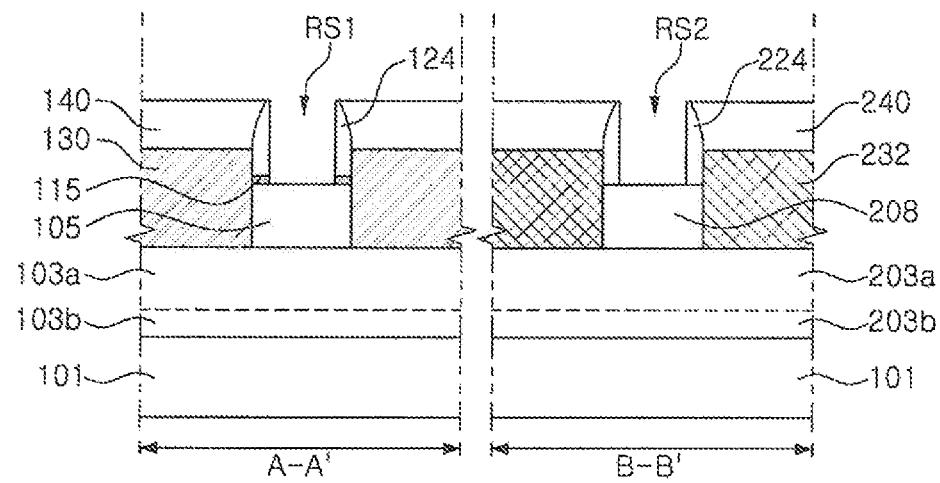
Figure 15B:
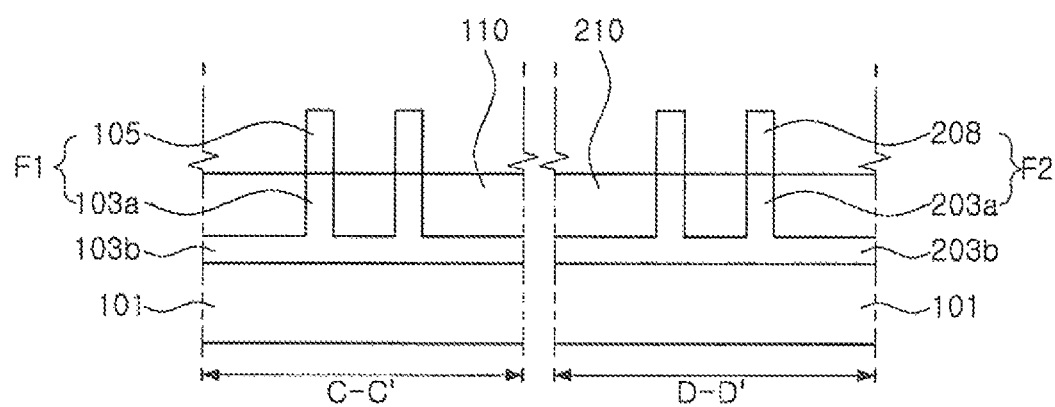

Referring to FIGS. 15A and 15B, a first gate recess RS1 and a second gate recess RS2 may be formed by removing the first and second sacrificial gates 120 and 220.

In detail, the first gate mask pattern 122 and the first sacrificial gate 120 may be selectively removed from the first region I, and then the capping layer 115 disposed below the first sacrificial gate 120 may be partially removed, to form the first gate recess RS1 exposing a portion of the first channel layer 105 and a portion of the isolation layer 110. Here, the capping layer 115 may be disposed to contact lower surfaces of the first sidewall spacers 124, and formed to have substantially the same width as a width of a lower surface of the first sidewall spacers 124.

The second gate mask pattern 222 and the second sacrificial gate 220 may be selectively removed from the second region II, and then the sacrificial oxidation layer 218 disposed below the second sacrificial gate 220 may be removed, to form the second gate recess RS2 exposing a portion of the second channel layer 208 and a portion of the isolation layer 210.

Processes of removing the first and second gate mask patterns 122 and 222, the first and second sacrificial gates 120 and 220, the capping layer 115, and the sacrificial oxidation layer 218 may be conducted using at least one of a dry etching process and a wet etching process.

Figure 16A:
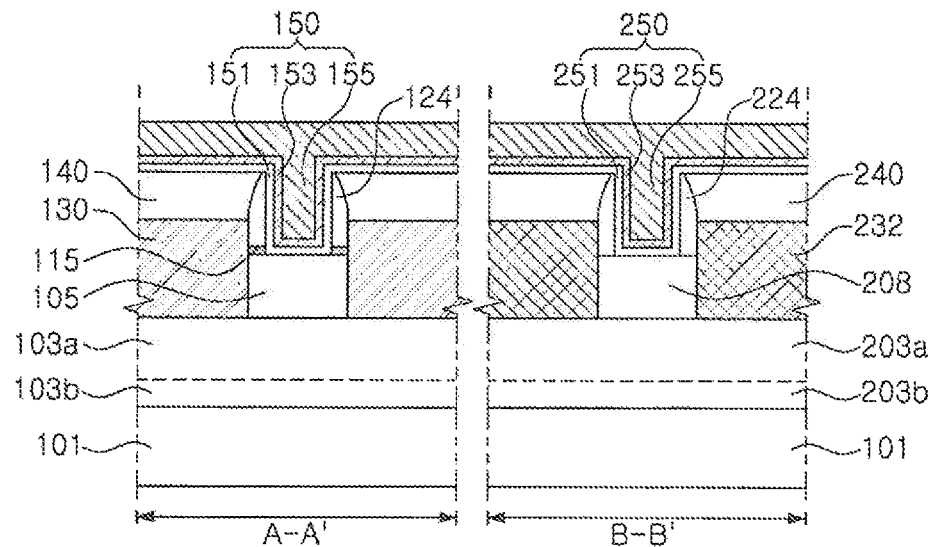
Figure 16B:
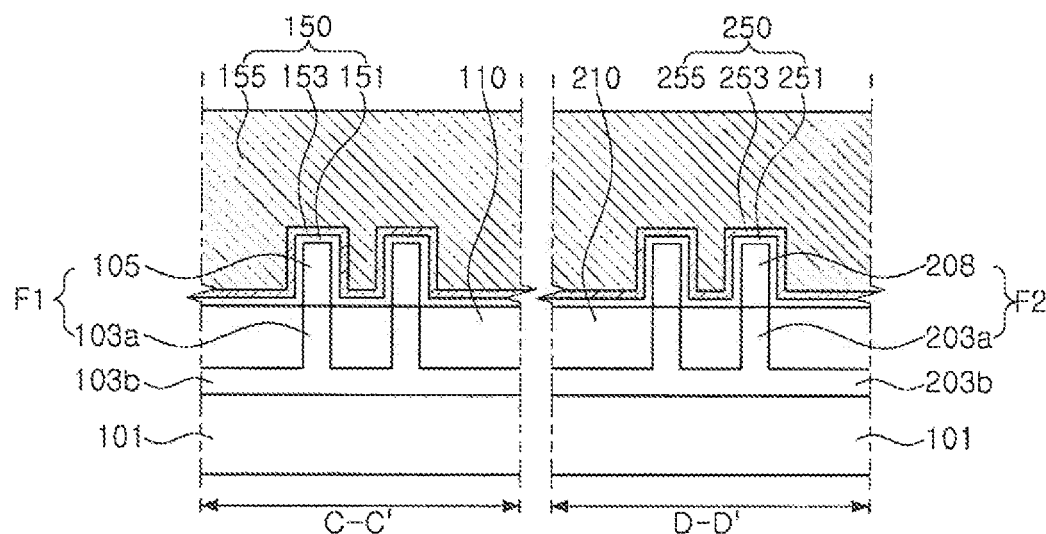

Referring to FIG. 16A and FIG. 16B, the first gate structure 150 and the second gate structure 250 may be formed respectively in the first gate recess RS1 and the second gate recess RS2.

A first gate insulation layer 151 may be formed substantially conformally along a sidewall and a lower surface of the first gate recess RS1. A first lower gate electrode 153 and a first upper gate electrode 155 may be sequentially formed on the first gate insulation layer 151.

A second gate insulation layer 251 may be formed substantially conformally along a sidewall and a lower surface of the second gate recess RS2. A second lower gate electrode 253 and a second upper gate electrode 255 may be sequentially formed on the second gate insulation layer 251.

The first and second gate insulation layers 151 and 251 may include a silicon oxide, a silicon nitride, or a high-K material. The first and second lower gate electrodes 153 and 253 may include, for example, a metal nitride, and the first and second upper gate electrodes 155 and 255 may include, for example, a metal material.

Subsequently, the semiconductor device illustrated in FIG. 6 may be manufactured by conducting a planarization process so that upper surfaces of the first and second inter-layer insulation layers 140 and 240 are exposed.

Figure 17A:
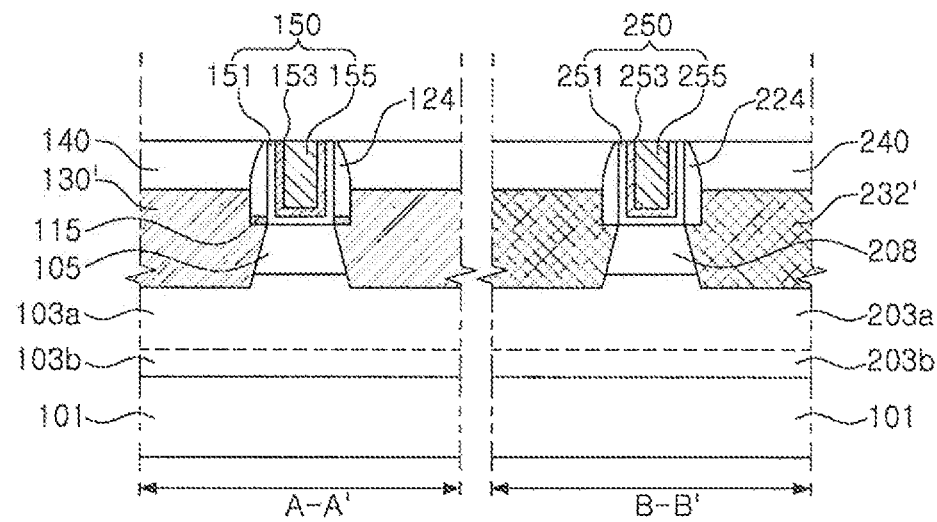
FIGS. 17A and 17B are cross-sectional views illustrating a semiconductor device according to example embodiments of the present inventive concepts.
Figure 17B:
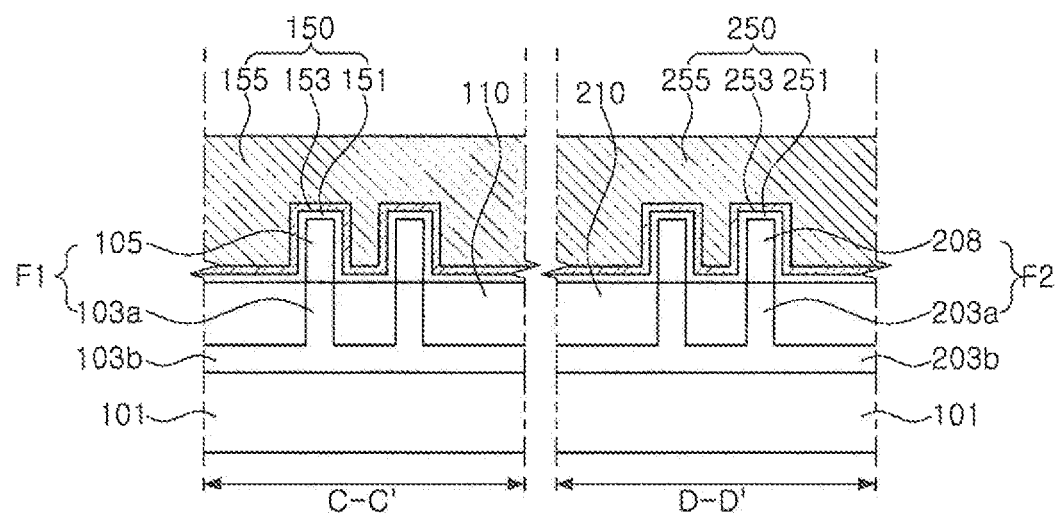

FIGS. 17A and 17B are cross-sectional views illustrating a semiconductor device according to example embodiments of the present inventive concepts.

In detail, the semiconductor device of FIGS. 17A and 17B is different from the semiconductor device 100 described above with reference to FIGS. 6, 7A, and 7B, in that the semiconductor device of FIGS. 17A and 17B has source/drain structures 130' and 232' having structures different from structures of the source/drain structures of the semiconductor device 100. Descriptions provided above will be omitted, and elements which are different from those described above will be described below.

Referring to FIGS. 17A and 17B, the first source/drain structures 130' disposed on both sides of a first channel layer 115 may have a structure including a protruding portion projecting downwardly from a first sidewall spacer 124. A sidewall of the first channel layer 105 is illustrated as being inclined, but is not limited thereto. Thus, a capping layer 115 may be disposed between a lower surface of the first sidewall spacers 124 and the protruding portion of the first source/drain structures 130'. In addition, the second source/drain structures 232' disposed on both sides of a second channel layer 208 may have a structure including a protruding portion projecting downwardly from a second sidewall spacer 224. A sidewall of the second channel layer 208 is illustrated as being inclined, but is not limited thereto.

Figure 18:
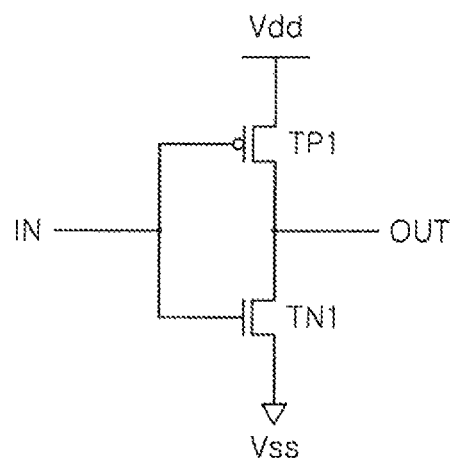
FIG. 18 is a circuit diagram of an inverter including a semiconductor device according to example embodiments of the present inventive concepts.

FIG. 18 is a circuit diagram of an inverter including a semiconductor device according to example embodiments of the present inventive concepts. In detail, the semiconductor device illustrated in FIG. 18 may be a complementary metal-oxide-semiconductor (CMOS) inverter.

Referring to FIG. 18, the CMOS inverter may be configured of a P-type metal-oxide-semiconductor (PMOS) field effect transistor TP1 and an N-type metal-oxide-semiconductor (NMOS) field effect transistor TN1. The PMOS field effect transistor TP1 and the NMOS field effect transistor TN1 may be connected in series between a power supply voltage line Vdd and a ground voltage line Vss. Input signals IN may be commonly input to gates of the PMOS field effect transistor TP1 and the NMOS field effect transistor TN1. In addition, output signals OUT may be commonly output from drains of the PMOS field effect transistor TP1 and the NMOS field effect transistor TN1. The CMOS inverter may output the output signal OUT by inverting the input signal IN. In detail, when a "high" logic value is input as the input signal IN of the inverter, a "low" logic value may be output as the output signal OUT, and when a "low" logic value is input as the input signal of the inverter, a "high" logic value may be output as the output signal OUT. The aforementioned transistors may be configured of the semiconductor device according to various example embodiments of the present inventive concepts described above.

Figure 19:
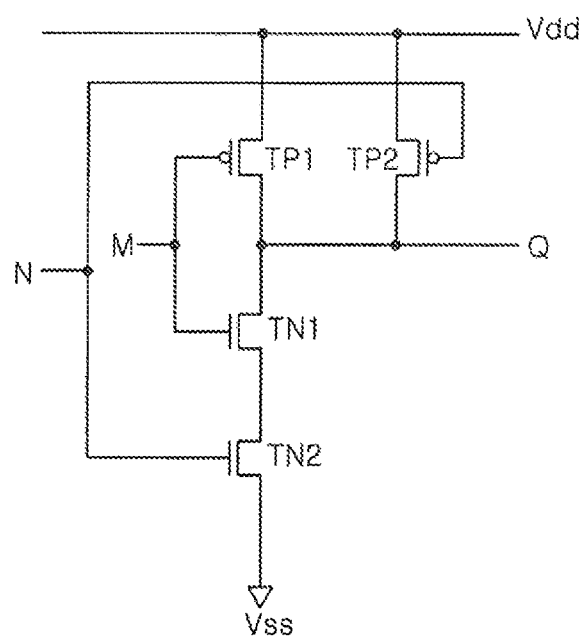
FIG. 19 is a circuit diagram of a NAND gate cell including a semiconductor device according to example embodiments of the present inventive concepts.

FIG. 19 is a circuit diagram of a NAND gate cell including a semiconductor device according to example embodiments of the present inventive concepts.

Referring to FIG. 19, the NAND gate cell may be configured to receive two input signals M and N and output a signal Q performing a NAND operation. The NAND gate cell may be configured of a PMOS transistor TP1 transmitting a "high" logic value to an output terminal Q when the input signal M has a "low" logic value, NMOS transistors TN1 and TN2 turned on and transmitting "low" logic value to the output terminal Q when both the input signals M and N have "high" logic values, and a PMOS transistor TP2 transmitting a "high" logic value to the output terminal Q when the input signal N has a "low" logic value.

When both the input signals M and N have "high" logic values, the PMOS transistors TP1 and TP2 are turned off, and the NMOS transistors TN1 and TN2 are turned on, such that a "low" logic value may be output to the output terminal Q.

When both the input signals M and N have "low" logic values, the PMOS transistors TP1 and TP2 are turned on, and the NMOS transistors TN1 and TN2 are turned off, such that a "high" logic value is output to the output terminal Q.

The aforementioned transistors may be configured of the semiconductor device according to various example embodiments of the present inventive concepts described above.

Figure 20:
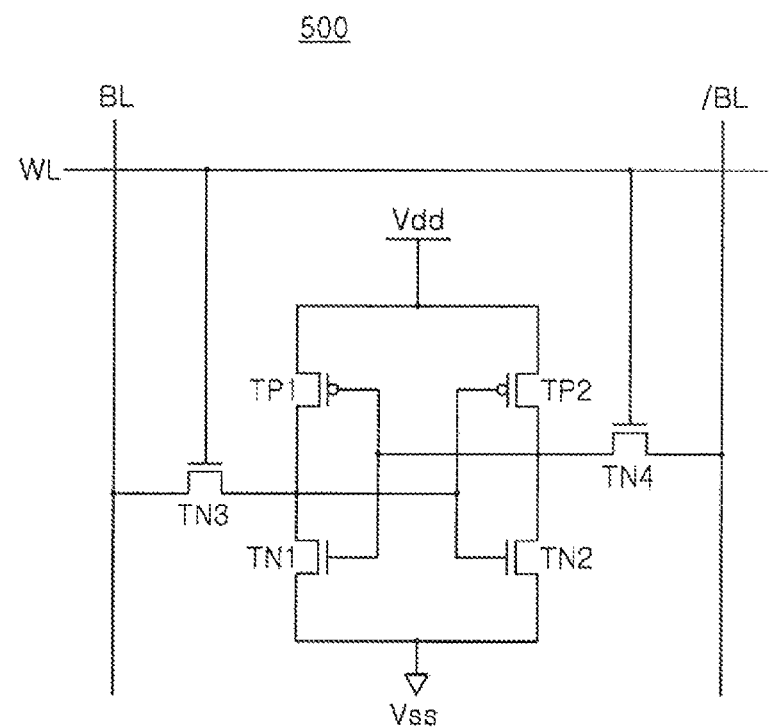
FIG. 20 is a circuit diagram of a SRAM cell including a semiconductor device according to example embodiments of the present inventive concepts.

FIG. 20 is a circuit diagram of an SRAM cell including a semiconductor device according to example embodiments of the present inventive concepts.

Referring to FIG. 20, the SRAM cell may be configured of a first pull-down transistor TN1, a second pull-down transistor TN2, a first pull-up transistor TP1, a second pull-up transistor TP2, a first pass transistor TN3, and a second pass transistor TN4. Here, sources of the first and second pull-down transistors TN1 and TN2 may be connected to a ground voltage line Vss, and sources of the first and second pull-up transistors TP1 and TP2 may be connected to a power supply voltage line Vdd.

In addition, the first pull-down transistor TN1 configured of an NMOS field effect transistor and the first pull-up transistor TP1 configured of a PMOS field effect transistor may be connected in series to configure a first inverter. Further, the second pull-down transistor TN2 configured of an NMOS field effect transistor and the second pull-up transistor TP2 configured of a PMOS field effect transistor may be connected in series to configure a second inverter. An output terminal of the first inverter may be connected to a source of the first pass transistor TN3, and an output terminal of the second inverter may be connected to a source of the second pass transistor TN4. In addition, an input terminal of the first inverter may be connected to the output terminal of the second inverter, and an input terminal of the second inverter may be connected to the output terminal of the first inverter. As a result, the first inverter and the second inverter may form a latch circuit. A drain of the first pass transistor TN3 may be connected to a first bit line BL, and the second pass transistor TN4 may be connected to a second bit line/BL. Gates of the first and second pass transistors TN3 and TN4 may be connected to a word line WL. The aforementioned transistors may be configured of the semiconductor device according to various example embodiments of the present inventive concepts described above.

Figure 21:
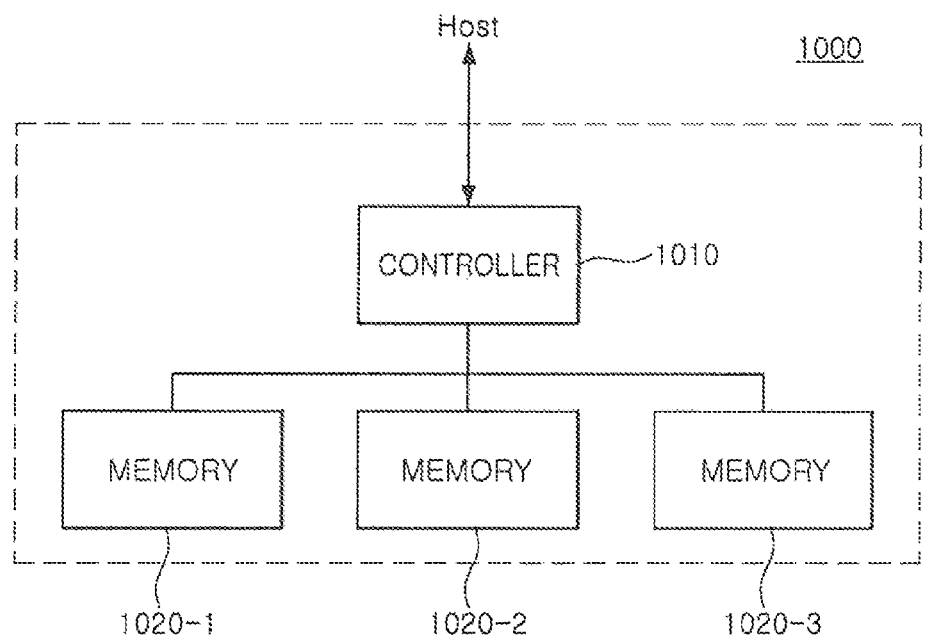
FIG. 21 is a block diagram illustrating a storage device including a semiconductor device according to example embodiments of the present inventive concepts.

FIG. 21 is a block diagram illustrating a storage device including a semiconductor device according to example embodiments of the present inventive concepts.

Referring to FIG. 21, a storage device 1000 according to example embodiments of the present inventive concepts may include a controller 1010 communicating with a HOST, and memories 1020-1, 1020-2, and 1020-3 storing data.

The HOST communicating with the controller 1010 may be provided as various types of electronic devices such as smartphones, digital cameras, desktop computers, laptop computers, media players, and the like. The controller 1010 may receive request for writing data or reading data from the HOST, and generate a command CMD to store data in the memories 1020-1, 1020-2, and 1020-3 or retrieve data from the memories 1020-1, 1020-2, and 1020-3. The controller 1010 or the memories 1020-1, 1020-2, and 1020-3 may include the semiconductor device according to the various example embodiments of the present inventive concepts described above.

As illustrated in FIG. 21, one or more memories 1020-1, 1020-2, and 1020-3 may be connected to the controller 1010 in parallel in the storage device 1000. The storage device 1000 with relatively high capacity such as solid state drive (SSD) may be implemented by connecting a plurality of the memories 1020-1, 1020-2, and 1020-3 to the controller 1010 in parallel.

Figure 22:
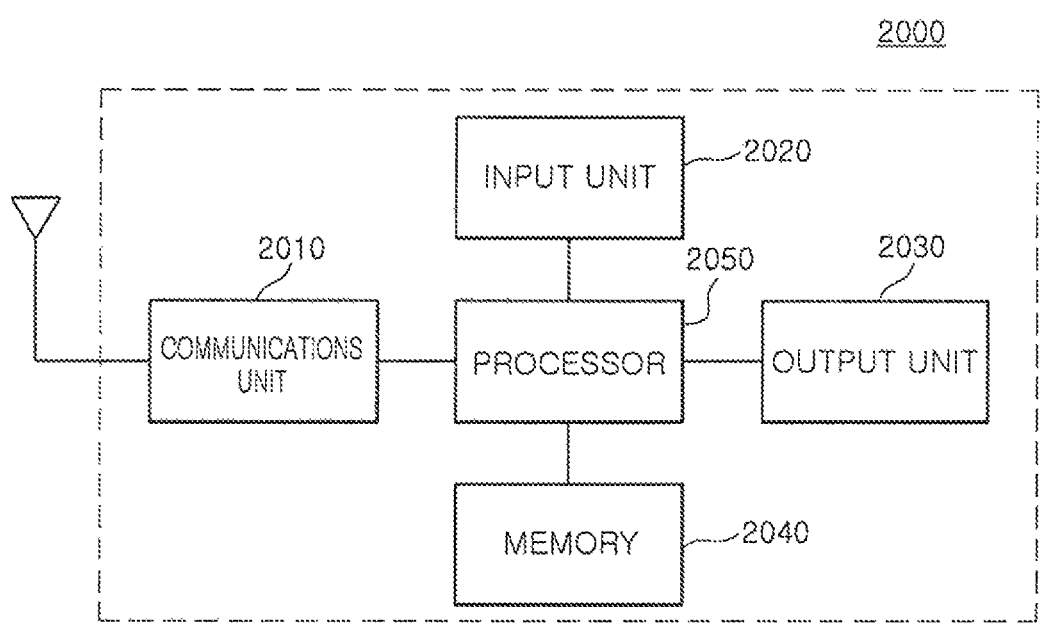
FIG. 22 is a block diagram illustrating an electronic device including a semiconductor device according to example embodiments of the present inventive concepts.

FIG. 22 is a block diagram illustrating an electronic device including a semiconductor device according to example embodiments of the present inventive concepts.

Referring to FIG. 22, an electronic device 2000 according to example embodiments of the present inventive concepts may include a communications unit 2010, an input unit 2020, an output unit 2030, a memory 2040, and a processor 2050.

The communications unit 2010 may include a wired/wireless communications module and may include a wireless internet module, a short-range communications module, a global positioning system (GPS) module, a mobile communications module, and the like. The wired/wireless communications module included in the communications unit 2010 may be connected to an external communications network based on various communications standards so as to transmit and receive data.

The input unit 2020 may be provided to allow a user to control operations of the electronic device 2000, and may include a mechanical switch, a touch screen, a voice recognition module, and the like. In addition, examples of the input unit 2020 may include a trackball mouse, a laser pointer mouse, or a finger mouse, and may further include various sensor modules allowing the user to input data.

Information processed by the electronic device 2000 may be output in a form of audio or video by the output unit 2030, and the memory 2040 may store a program for processing and controlling operations of the processor 2050, or may store data. The processor 2050 may store or retrieve data by transmitting command to the memory 2040 according to required operation.

The memory 2040 may be installed in the electronic device 2000 or communicate with the processor 2050 through a separate interface. When the memory 2040 communicates with the processor 2050 through a separate interface, the processor 2050 may store data in the memory 2040 or retrieve data therefrom through various interface standards such as SD, SDHC, SDXC, MICRO SD, USB, and the like.

The processor 2050 may control operations of respective units included in the electronic device 2000. The processor 2050 may perform controlling and processing related to audio calls, video calls, data communications, and the like, or controlling and processing for playing and managing a multimedia. In addition, the processor 2050 may process an input transmitted from the user through the input unit 2020 and output a corresponding result thereof through the output unit 2030. The processor 2050 may store data required to control operations of the electronic device 2000 in the memory 2040 or retrieve the data from the memory 2040. At least one of the processor 2050 and the memory 2040 may include a semiconductor device according to the various example embodiments of the present inventive concepts.

Figure 23:
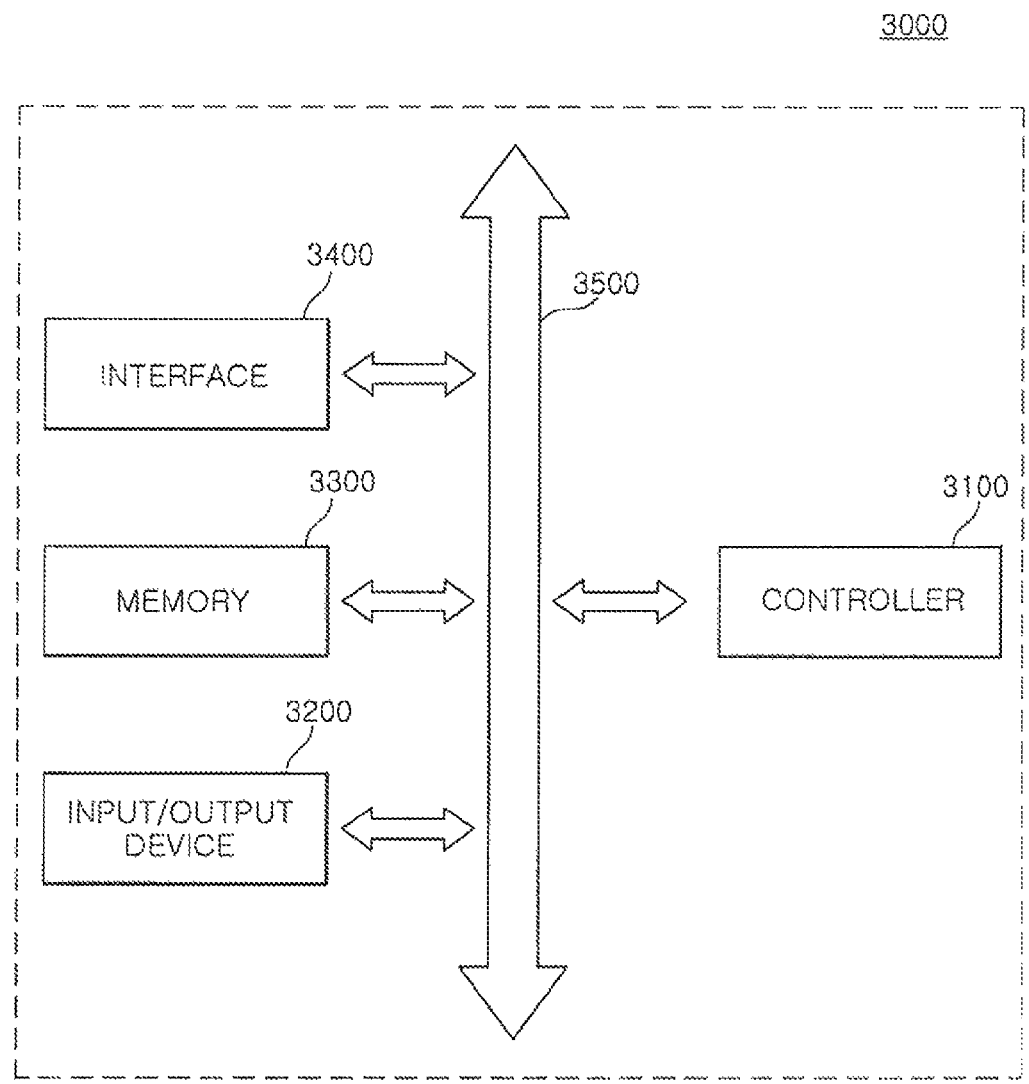
FIG. 23 is a block diagram illustrating a system including a semiconductor device according to example embodiments of the present inventive concepts.

FIG. 23 is a view schematically illustrating a system including a semiconductor device according to example embodiments of the present inventive concepts.

Referring to FIG. 23, a system 3000 may include a controller 3100, an input/output device 3200, a memory 3300, and an interface 3400. The system 3000 may be provided as a mobile system or a system transmitting or receiving information. The mobile system may be provided, for example, as a portable digital assistant (PDA), a portable computer, a web tablet, a wireless phone, a mobile phone, a digital music player, or a memory card.

The controller 3100 may execute a program and control the system 3000. The controller 3100 may be provided as, for example, a microprocessor, a digital signal processor, a microcontroller, or a device similar thereto.

The input/output device 3200 may be used in inputting or outputting data of the system 3000. The system 3000 may be connected to an external device such as a personal computer or a network using the input/output device 3200, and exchange data with the connected external device. The input/output device 3200 may be provided as, for example, a keypad, a keyboard, or a display.

The memory 3300 may store a code for an operation of the controller 3100 and/or data, and/or store data processed by the controller 3100.

The interface 3400 may serve as a passage for data transmission between the system 3000 and an external device. The controller 3100, the input/output device 3200, the memory 3300, and/or the interface 3400 may communicate with each other through a bus 3500.

At least one of the controller 3100 and the memory 3300 may include a semiconductor device according to the various example embodiments of the present inventive concepts.

As set forth above, according to example embodiments of the present inventive concepts, semiconductor devices may have an improved mobility characteristic due to the formation of a capping layer able to prevent oxidation of a channel layer including germanium.

While example embodiments have been shown and described above, it will be apparent to those skilled in the art that modifications and variations could be made without departing from the scope of the present inventive concepts as defined by the appended claims.

What is claimed is:

1. A semiconductor device, comprising:
a substrate;
a plurality of active fins on the substrate, the active fins including a buffer layer on the substrate and a channel layer on the buffer layer, and the channel layer having a first lattice constant higher than a second lattice constant of the buffer layer;
a gate structure covering the channel layer and intersecting the active fins;
a plurality of sidewall spacers on both sidewalls of the gate structure;
a plurality of source/drain structures on both sides of the channel layer; and
a plurality of capping layers contacting lower surfaces of the sidewall spacers and having a width substantially the same as a width of the lower surfaces of the sidewall spacers,
wherein the channel layer comprises a silicon-germanium compound, and
wherein the channel layer comprises a central portion having a first germanium content and a surface portion having a second germanium content higher than the first germanium content.

2. The semiconductor device of claim 1, wherein the plurality of capping layers are disposed between the sidewall spacers and the channel layer, and wherein a sidewall of respective ones of the plurality of capping layers contacts respective ones of the plurality of source/drain structures.

3. The semiconductor device of claim 1, wherein the plurality of capping layers extend along the gate structure while covering the channel layer.

4. The semiconductor device of claim 1, wherein the plurality of capping layers include a material preventing oxygen from being diffused into the channel layer.

5. The semiconductor device of claim 4, wherein the material preventing oxygen from being diffused into the channel layer comprises SiN and/or SiCN.

6. The semiconductor device of claim 1, wherein the buffer layer comprises a third germanium content lower than the second germanium content in the channel layer.

7. The semiconductor device of claim 1, wherein respective ones of the plurality of source/drain structures comprise a protruding portion projecting under the plurality of sidewall spacers.

8. The semiconductor device of claim 7, wherein respective ones of the plurality of capping layers are disposed between a lower surface of respective ones of the plurality of sidewall spacers and the protruding portion of respective ones of the plurality of source/drain structures.

9. A semiconductor device, comprising:
a substrate;
active fins on the substrate, the active tins including a buffer layer on the substrate and a channel layer on the buffer layer, wherein the channel layer has a first lattice constant higher than a second lattice constant of the buffer layer;
an isolation layer between the active fins;
a gate structure covering the channel layer and intersecting the active fins;
sidewall spacers on both sidewalls of the gate structure;
source/drain structures on both sides of the channel layer; and
capping layers contacting respective lower surfaces of the sidewall spacers and having a first width substantially the same as a second width of the lower surfaces of the sidewall spacers,
wherein the source/dram structures comprise a silicon-germanium compound having a first germanium content higher than a second germanium content in the channel layer.

10. The semiconductor device of claim 9, wherein the capping layers extend along the gate structure in a direction and are disposed continuously between the sidewall spacers and the channel layer and between the sidewall spacers and the isolation layer in the direction.

11. The semiconductor device of claim 9, wherein the source/drain structures are in contact with the channel layer at both sides of the gate structure.

12. The semiconductor device of claim 9, wherein the gate structure comprises a gate insulation layer comprising a high-k material and a gate electrode comprising a metal material.

13. The semiconductor device of claim 9, wherein the channel layer comprises a silicon-germanium compound, and
wherein the channel layer comprises a central portion having a third germanium content and a surface portion having the second germanium content higher than the first germanium content.

14. The semiconductor device of claim 9, wherein the source/drain structures comprise respective protruding portions projecting downwardly from the sidewall spacers, and
wherein the capping layers are between respective lower surfaces of the sidewall spacers and the respective protruding portions of the source/drain structures.

15. A semiconductor device, comprising:
a substrate comprising a first region and a second region;
a lower buffer layer on the substrate;
first active fins in the first region comprising a first channel layer and a first upper buffer layer connected to the lower buffer layer;
second active fins in the second region comprising a second channel layer having a second lattice constant lower than a first lattice constant of the first channel layer and a second upper buffer layer connected to the lower buffer layer;
a first gate structure covering the first channel layer and intersecting the first active fins;
a second gate structure covering the second channel layer and intersecting the second active fins;
first sidewall spacers on both sidewalk of the first gate structure;
second sidewall spacers on both sidewalls of the second gate structure; and
a capping layer contacting lower surfaces of the first sidewall spacers and having a first width substantially the same as a second width of the lower surfaces of the first sidewall spacers,
wherein the first channel layer comprises a silicon-germanium compound,
wherein the second channel layer comprises silicon,
wherein the second sidewall spacers directly contact the second channel layer, and wherein the first channel layer comprises a central portion having a first germanium content and a surface portion having a second germanium content higher than the first germanium content.

* * * * *